(12) United States Patent
Shin et al.

(10) Patent No.: US 12,068,242 B2
(45) Date of Patent: Aug. 20, 2024

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Hongsik Shin, Seoul (KR); Dong Kwon Kim, Suwon-si (KR); Jinwook Lee, Seoul (KR); Jongchul Park, Seoul (KR); Wonhyuk Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 482 days.

(21) Appl. No.: 17/373,900

(22) Filed: Jul. 13, 2021

(65) Prior Publication Data

US 2022/0189870 A1    Jun. 16, 2022

(30) Foreign Application Priority Data

Dec. 15, 2020    (KR) .................. 10-2020-0175051

(51) Int. Cl.
*H01L 23/522*    (2006.01)
*H01L 21/768*    (2006.01)
(Continued)

(52) U.S. Cl.
CPC .... *H01L 23/5226* (2013.01); *H01L 21/76831* (2013.01); *H01L 21/76832* (2013.01);
(Continued)

(58) Field of Classification Search
CPC ............. H01L 23/5226; H01L 23/5283; H01L 21/76831; H01L 21/76832; H01L 21/76897; H01L 21/76834; H01L 21/823475; H01L 21/823425; H01L 21/823431; H01L 21/823468;
(Continued)

(56) References Cited

U.S. PATENT DOCUMENTS 10,121,700 B2    11/2018  Li
10,204,994 B2    2/2019   Xie et al.
(Continued)

FOREIGN PATENT DOCUMENTS

CN          109309053 A      2/2019

*Primary Examiner* — Steven H Loke
*Assistant Examiner* — Anthony A Pulatov
(74) *Attorney, Agent, or Firm* — Muir Patent Law, PLLC

(57) ABSTRACT

A semiconductor device including a gate pattern on a substrate and including a gate dielectric layer, a gate electrode, and a gate capping pattern that are sequentially stacked; a gate spacer on a sidewall of the gate pattern; a source/drain pattern in the substrate; a contact pad on the source/drain pattern, a source/drain contact on the contact pad; and a buried dielectric pattern between the gate spacer and the source/drain contact, wherein the gate spacer includes a first segment between the gate electrode and the source/drain pattern; a second segment that extends from the first segment and between the gate electrode and the source/drain contact; and a third segment on the second segment, the buried dielectric pattern is between the third segment and the source/drain contact, and is absent between the first segment and the contact pad and is absent between the second segment and the source/drain contact.

20 Claims, 36 Drawing Sheets

(51) Int. Cl.
*H01L 29/66* (2006.01)
*H01L 29/78* (2006.01)
*H01L 29/786* (2006.01)

(52) U.S. Cl.
CPC .... *H01L 21/76897* (2013.01); *H01L 29/6656* (2013.01); *H01L 29/785* (2013.01); *H01L 29/78696* (2013.01)

(58) Field of Classification Search
CPC ........... H01L 21/823821; H01L 21/845; H01L 21/823864; H01L 21/28132–2815; H01L 29/6656; H01L 29/78696; H01L 29/42392; H01L 29/41791; H01L 29/165; H01L 29/6653; H01L 29/66553; H01L 29/66795–66818; H01L 29/785–7856; H01L 29/04–045; H01L 29/16–1608; H01L 29/18–185; H01L 29/22–2206; H01L 29/36–365; H01L 29/66689; H01L 29/66719; H01L 29/4983; H01L 29/51–518; H01L 27/0886; H01L 27/0924; H01L 27/10826; H01L 27/10879; H01L 27/1211; H01L 2029/7857–7858; H01L 2924/13067
See application file for complete search history.

(56) References Cited

U.S. PATENT DOCUMENTS

| | | | |
|---|---|---|---|
| 2007/0235823 | A1* | 10/2007 | Hsu ................. H01L 21/823864 257/411 |
| 2014/0124842 | A1* | 5/2014 | Wang ...................... H01L 29/78 257/288 |
| 2019/0043959 | A1* | 2/2019 | Lee ................... H01L 23/53209 |
| 2020/0058769 | A1 | 2/2020 | Khaderbad et al. |
| 2020/0168720 | A1 | 5/2020 | Kwak et al. |
| 2020/0243385 | A1 | 7/2020 | Huang et al. |
| 2021/0057538 | A1 | 2/2021 | Shin et al. |
| 2021/0083067 | A1* | 3/2021 | Wang ....................... H01L 29/45 |
| 2021/0305397 | A1* | 9/2021 | Vellianitis ......... H01L 29/78391 |
| 2021/0351299 | A1* | 11/2021 | Huang .................. H01L 29/165 |

* cited by examiner

SEMICONDUCTOR DEVICE AND METHOD OF FABRICATING THE SAME

CROSS-REFERENCE TO RELATED APPLICATION

Korean Patent Application No. 10-2020-0175051, filed on Dec. 15, 2020 in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Semiconductor devices may be beneficial in the electronic industry because of their small size, multi-functionality, and low fabrication cost. Semiconductor devices may encompass semiconductor memory devices storing logic data, semiconductor logic devices processing operations of logic data, and hybrid semiconductor devices having both memory and logic elements.

SUMMARY

The embodiments may be realized by providing a semiconductor device including a substrate; a gate pattern on the substrate, the gate pattern including a gate dielectric layer, a gate electrode, and a gate capping pattern that are sequentially stacked; a gate spacer that covers a sidewall of the gate pattern; a source/drain pattern in the substrate at a side of the gate pattern; a contact pad on the source/drain pattern, the contact pad having a top surface lower than a top surface of the gate electrode; a source/drain contact on the contact pad; and a buried dielectric pattern between the gate spacer and the source/drain contact, the buried dielectric pattern surrounding the source/drain contact, wherein the gate spacer includes a first segment between the gate electrode and the source/drain pattern, the first segment having a first width; a second segment that extends from the first segment and is between the gate electrode and the source/drain contact, the second segment having the first width; and a third segment on the second segment, the third segment having a second width that is less than the first width, the buried dielectric pattern is between the third segment and the source/drain contact, and the buried dielectric pattern is absent between the first segment and the contact pad and is absent between the second segment and the source/drain contact.

The embodiments may be realized by providing a semiconductor device including a substrate; an active fin that protrudes from the substrate; a gate pattern that runs across the active fin, the gate pattern including a gate dielectric layer, a gate electrode, and a gate capping pattern that are sequentially stacked; a source/drain pattern in the substrate on a side of the gate pattern; a contact pad on the source/drain pattern, the contact pad having a top surface lower than a top surface of the gate electrode; a source/drain contact on the contact pad; a gate spacer that includes a first segment between the gate pattern and the contact pad, a second segment between the gate pattern and the source/drain contact, and a third segment on the second segment, the third segment having a width less than a width of the second segment; a first dielectric spacer and a second dielectric spacer between the second segment and the source/drain contact; and a third dielectric spacer and a buried dielectric pattern between the third segment and the source/drain contact, wherein a width of the buried dielectric pattern is greater than a width of the first dielectric spacer, greater than a width of the second dielectric spacer, and greater than a width of the third dielectric spacer.

The embodiments may be realized by providing a semiconductor device including a substrate; a gate pattern on the substrate and including a gate dielectric layer, a gate electrode, and a gate capping pattern that are sequentially stacked, the gate pattern having a first sidewall and a second sidewall that are opposite to each other; a source/drain pattern in the substrate adjacent to the first sidewall of the gate pattern; a contact pad on the source/drain pattern, the contact pad having a top surface lower than a top surface of the gate electrode; a source/drain contact on the contact pad; a first gate spacer that covers the first sidewall of the gate pattern; and a second gate spacer that covers the second sidewall of the gate pattern, wherein the first gate spacer includes a first segment between the gate pattern and the contact pad, a second segment between the gate pattern and the source/drain contact, and a third segment on the second segment, the third segment having a width less than a width of the second segment, and the width of the third segment is less than a width of the second gate spacer.

The embodiments may be realized by providing a method of fabricating a semiconductor device, the method including forming a plurality of gate patterns and a plurality of gate spacers that cover sidewalls of the gate patterns, the gate patterns running across a substrate, and each of the gate patterns including a gate dielectric layer, a gate electrode, and a gate capping pattern that are sequentially stacked; forming at least one source/drain pattern on the substrate between the gate spacers; forming a contact pad on the at least one source/drain pattern; forming a plurality of first dielectric spacers that cover lower sidewalls of the gate spacers adjacent to each other on the contact pad and that expose upper sidewalls of the gate spacers adjacent to each other on the contact pad; performing a lateral etch process to remove portions of the gate spacers to form a plurality of recess regions on the gate spacers, the portions being adjacent to upper sidewalls of the gate spacers and not covered with the first dielectric spacers; forming a buried dielectric pattern that fills the recess regions and a space between the gate spacers; removing a portion of the gate capping pattern from the gate patterns to form a gate contact hole that exposes the gate electrode; removing a portion of the buried dielectric pattern to form a source/drain contact hole that exposes the contact pad; and forming a gate contact in the gate contact hole and a source/drain contact in the source/drain contact hole.

BRIEF DESCRIPTION OF THE DRAWINGS

Features will be apparent to those of skill in the art by describing in detail exemplary embodiments with reference to the attached drawings in which:

FIGS. 3A to 15A illustrate plan views of stages in a method of fabricating a semiconductor device having the plan view of FIG. 1A.

FIGS. 3B to 15B illustrate cross-sectional views taken along lines A-A', B-B', and C-C' of FIGS. 3A to 15A, respectively.

DETAILED DESCRIPTION

Figure 1A:
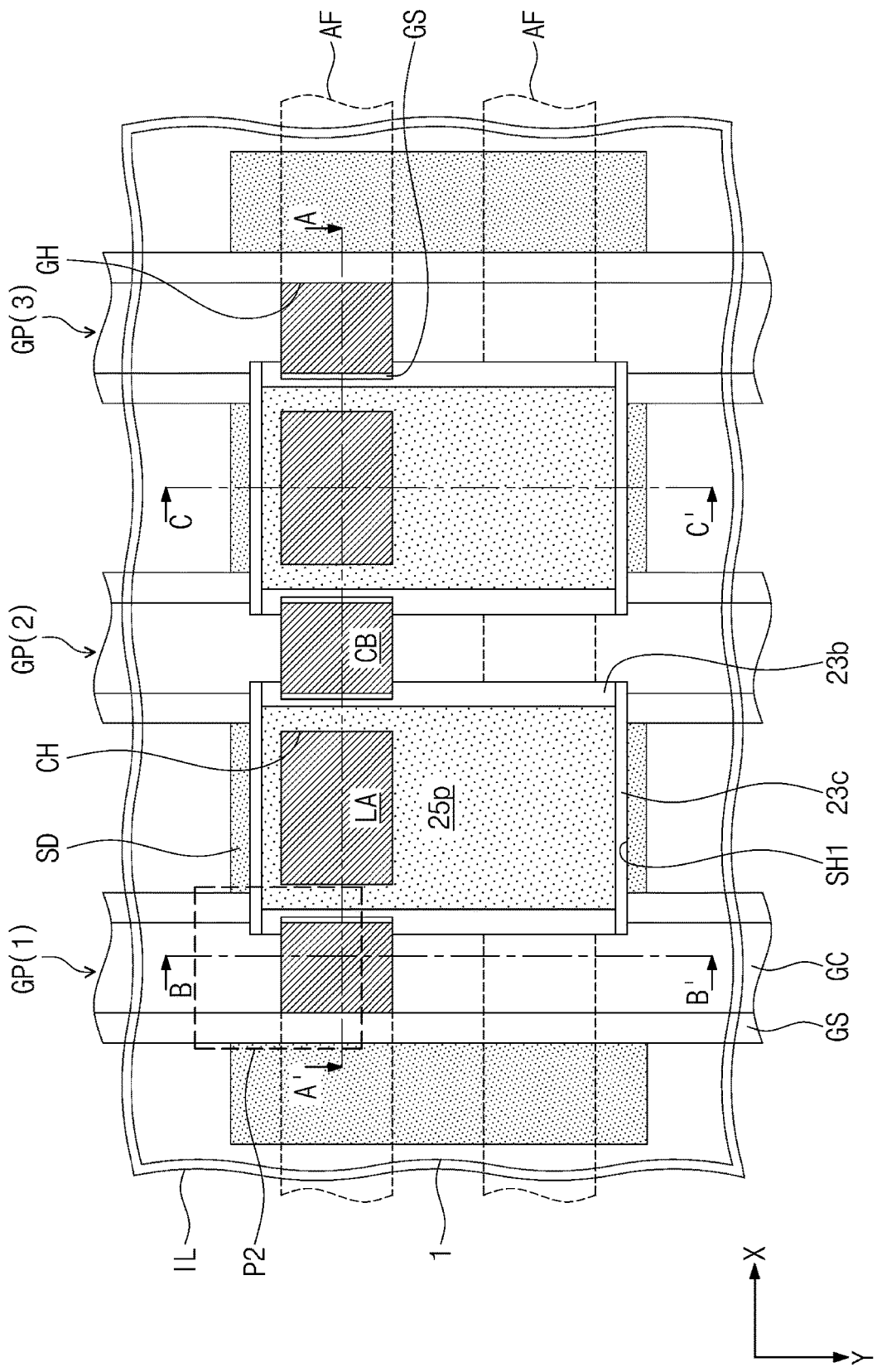
FIG. 1A illustrates a plan view of a semiconductor device according to some embodiments.
Figure 1B:
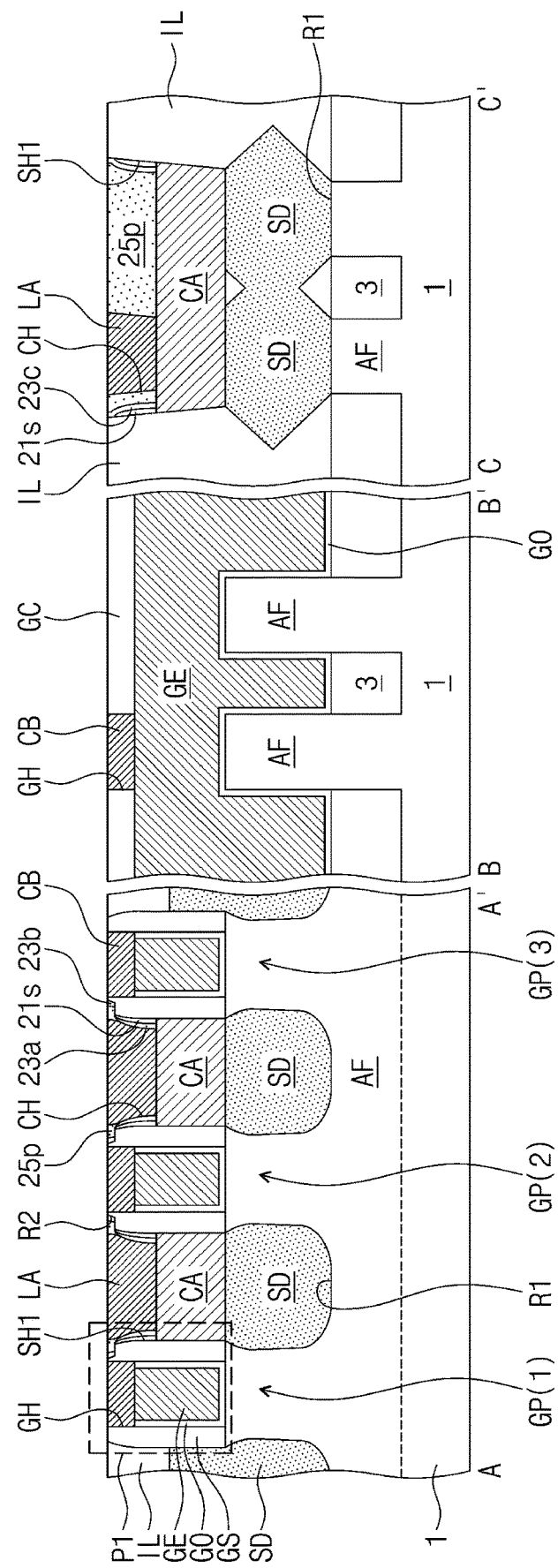
FIG. 1B illustrates a cross-sectional view taken along lines A-A', B-B', and C-C' of FIG. 1A.

FIG. 1A illustrates a plan view of a semiconductor device according to some embodiments. FIG. 1B illustrates a cross-sectional view taken along lines A-A', B-B', and C-C' of FIG. 1A. A semiconductor device of FIG. 1B may correspond to an example of FinFET devices.

Referring to FIGS. 1A and 1B, active fins AF may protrude from a substrate 1. The substrate 1 may include a device isolation layer 3 thereon at sides of the active fins AF. The active fins AF may have top surfaces and upper sidewalls higher than a top surface of the device isolation layer 3. The substrate 1 may be a single-crystalline silicon substrate or a silicon-on-insulator (SOI) substrate. The device isolation layer 3 may have a single layer or multiple layers including, e.g., a silicon oxide layer, a silicon nitride layer, or a silicon oxynitride layer. When viewed in plan, the active fin AF may have a linear or bar shape that extends (e.g., lengthwise) in a first direction X. As used herein, the term "or" is not an exclusive term, e.g., "A or B" would include A, B, or A and B.

Gate patterns GP may run or extend across the active fin AF in a second direction Y that intersects the first direction X. The gate patterns GP may include first, second, and third gate patterns GP(1), GP(2), and GP(3) that are arranged side by side (e.g., spaced apart) in the first direction X. The gate patterns GP may each include a gate dielectric layer GO, a gate electrode GE, and a gate capping pattern GC that are sequentially stacked. The gate dielectric layer GO may include a silicon oxide layer or a high-k dielectric layer whose dielectric constant is greater than that of a silicon oxide layer. The high-k dielectric layer may include a metal oxide layer, e.g., an aluminum oxide layer.

The gate electrode GE may include a layer of metal, e.g., tungsten, copper, or aluminum. In an implementation, the gate electrode GE and the gate dielectric layer GO may include a work function layer, a diffusion break layer, or the like therebetween. The diffusion break layer may include, e.g., a titanium nitride layer or a metal nitride layer. The gate capping pattern GC may include, e.g., a silicon nitride layer.

The gate patterns GP may have sidewalls, each of which being covered with a gate spacer GS. The gate spacer GS may include a silicon nitride layer or a double or triple layer including a silicon nitride layer and a silicon oxide layer. The gate dielectric layer GO may extend between the gate electrode GE and the gate spacer GS, and may contact (e.g., directly contact) the gate capping pattern GC.

Each of the active fins AF may have a fin recess region R1 at a side of the gate spacer GS. Source/drain patterns SD may be correspondingly in the fin recess regions R1. Neighboring source/drain patterns SD may be in contact with each other. The source/drain pattern SD may be an epitaxial layer of which material is the same as that of the substrate 1. In an implementation, the source/drain pattern SD may be a silicon epitaxial layer. The source/drain pattern SD may further include a material different from that of the substrate 1. In an implementation, the source/drain pattern SD may be a silicon-germanium epitaxial layer. The source/drain pattern SD may be doped with n-type or p-type impurities. In an implementation, the source/drain pattern SD may be doped with phosphorus, arsenic, or boron. The source/drain pattern SD may be formed of either an epitaxial layer having a plurality of regions whose impurity concentrations are different from each other or a plurality of epitaxial layers whose impurity concentrations are different from each other.

An interlayer dielectric layer IL may cover the gate patterns GP, the gate spacers GS, and the source/drain patterns SD. In an implementation, the interlayer dielectric layer IL may be a multiple layer including a silicon oxide layer, a silicon nitride layer, a silicon oxynitride layer, or a porous low-k dielectric layer.

The interlayer dielectric layer IL may have a pad hole SH1 that exposes the source/drain patterns SD. As shown in cross-section of FIG. 1B taken along line A-A', a sidewall of the gate spacer GS may be exposed in the pad hole SH1. The pad hole SH1 may accommodate a contact pad CA in contact with the source/drain pattern SD. As shown in cross-section of FIG. 1B taken along line A-A', the contact pad CA may have a sidewall in contact (e.g., direct contact) with that of the gate spacer GS. The contact pad CA may include a metal. The metal may include, e.g., tungsten, aluminum, cobalt, titanium, or molybdenum. As shown in cross-section of FIG. 1B taken along line C-C', the sidewall of the contact pad CA may be in contact (e.g., direct contact) with the interlayer dielectric layer IL.

The pad hole SH1 may also accommodate a buried dielectric pattern 25p on the contact pad CA. The buried dielectric pattern 25p may include, e.g., SiOC (silicon oxycarbide). The buried dielectric pattern 25p may include a source/drain contact hole CH therein. A source/drain contact LA may be in the source/drain contact hole CH. The source/drain contact LA may penetrate the buried dielectric pattern 25p and may contact (e.g., directly contact) the contact pad CA. The source/drain contact LA may have a lower width less than a width of the contact pad CA (e.g., may have a trapezoidal cross section).

The gate capping pattern GC may include a gate contact hole GH that exposes the gate electrode GE. The gate contact hole GH may accommodate a gate contact CB in contact (e.g., direct contact) with the gate electrode GE. The gate contact CB may be in contact (e.g., direct contact) with an inner wall of the gate spacer GS and a top surface of the gate dielectric layer GO.

The source/drain contact LA and the gate contact CB may include a same conductive material. In an implementation, the source/drain contact LA and the gate contact CB may include a crystalline or amorphous metal. The metal may include, e.g., tungsten, aluminum, cobalt, titanium, or molybdenum. The metal included in the source/drain contact LA may have or be in a same crystal state as that of the metal included in the gate contact CB.

As shown in cross-section of FIG. 1B taken along line A-A', first, second, and third dielectric spacers 21s, 23a, and 23b and a portion of the buried dielectric pattern 25p may be between the gate spacer GS and the source/drain contact LA. As shown in cross-section of FIG. 1B taken along line C-C', the first dielectric spacer 21s and a fourth dielectric spacer 23c may be between the buried dielectric pattern 25p and the interlayer dielectric layer IL.

The second, third, and fourth dielectric spacers 23a, 23b, and 23c may include a same material. The second, third, and fourth dielectric spacers 23a, 23b, and 23c may include, e.g., a first material which is the same as that of the gate spacer GS. The first dielectric spacer 21s may include a second material different from the first material of the gate spacer GS and the second, third, and fourth dielectric spacers 23a, 23b, and 23c. The second material may have an etch selectivity with respect to the first material. In an implementation, the first material may include silicon nitride, and the second material may include silicon oxide, SiOC, or $Al_2O_3$.

In an implementation, the second material may have an electric constant different from that of the first material. The electric constant of the second material may be less than that of the first material. In an implementation, a parasitic capacitance may be provided between the gate contact CB and the source/drain contact LA.

Figure 2A:
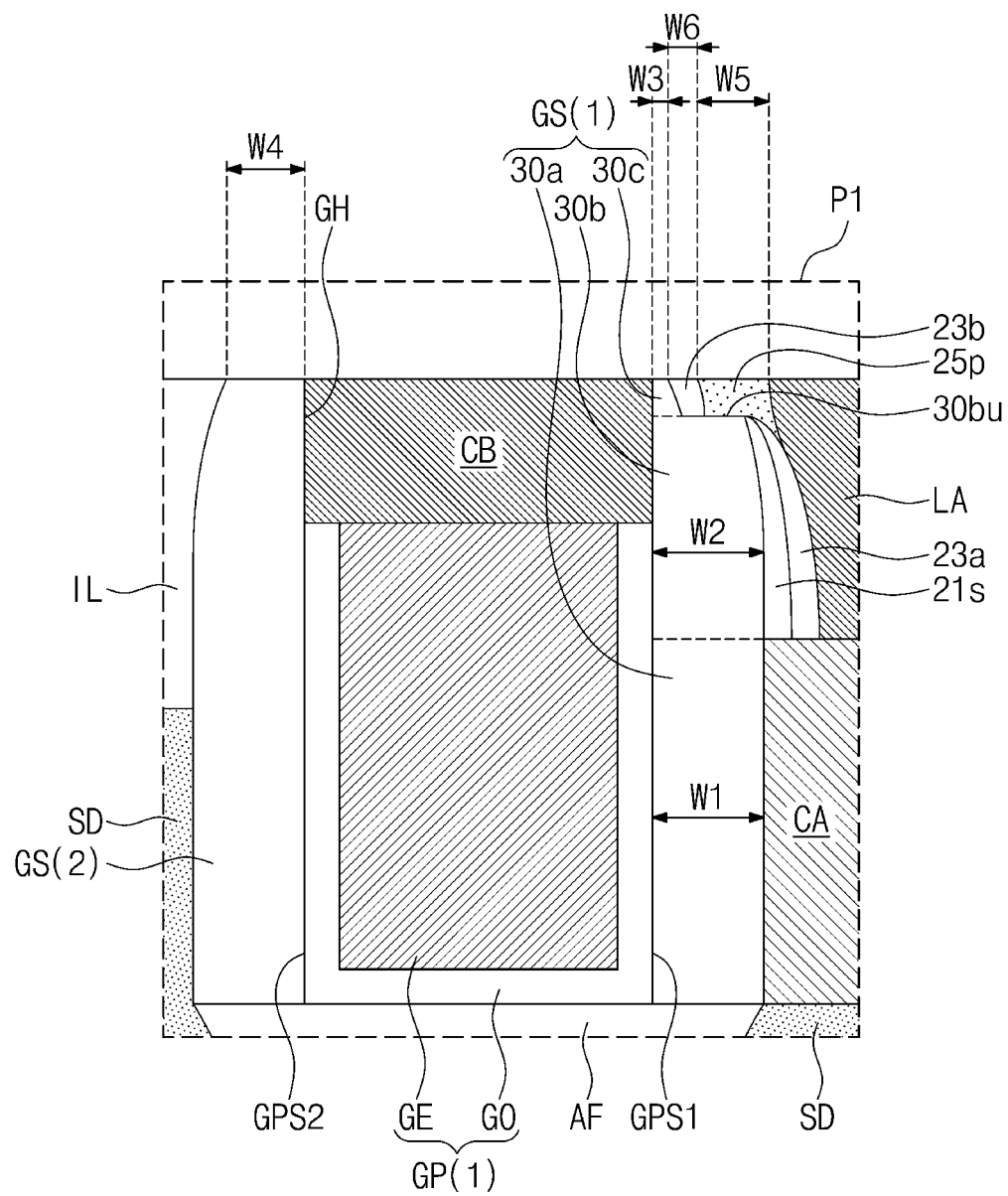
FIG. 2A illustrates an enlarged view of section P1 of FIG. 1B.
Figure 2B:
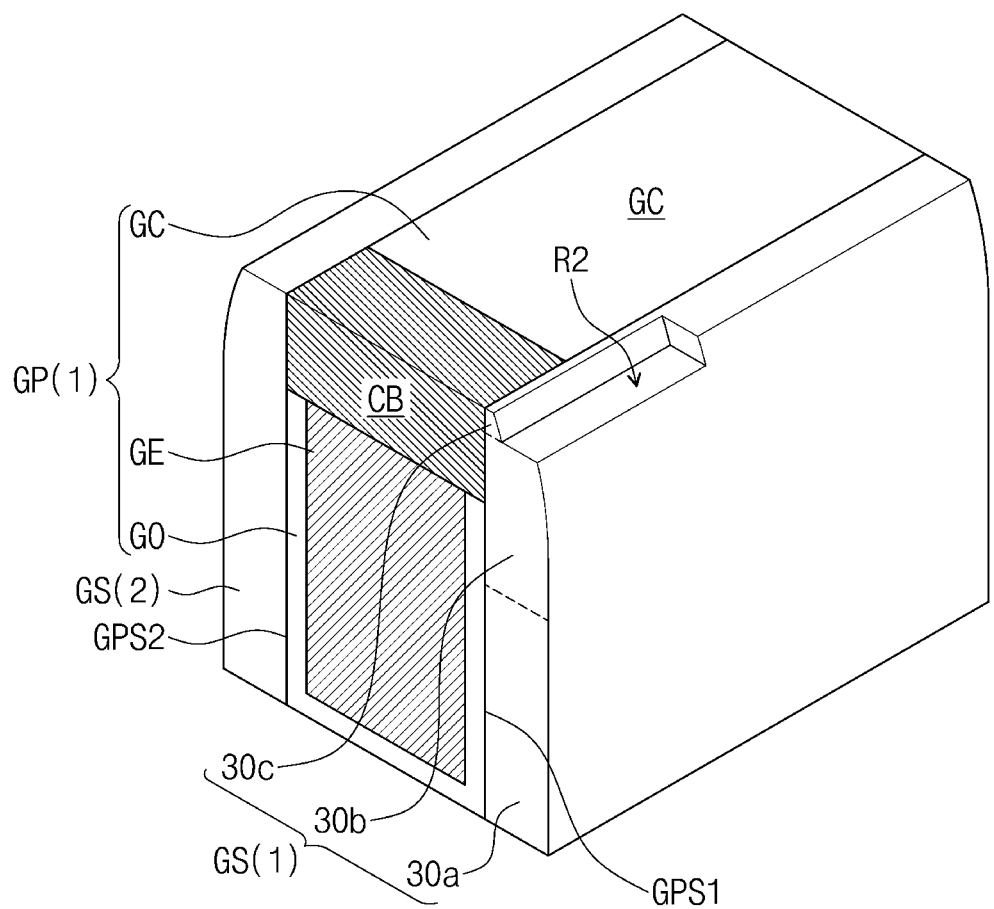
FIG. 2B illustrates a perspective view of section P2 of a first gate pattern depicted in FIG. 1A.
Figure 2C:
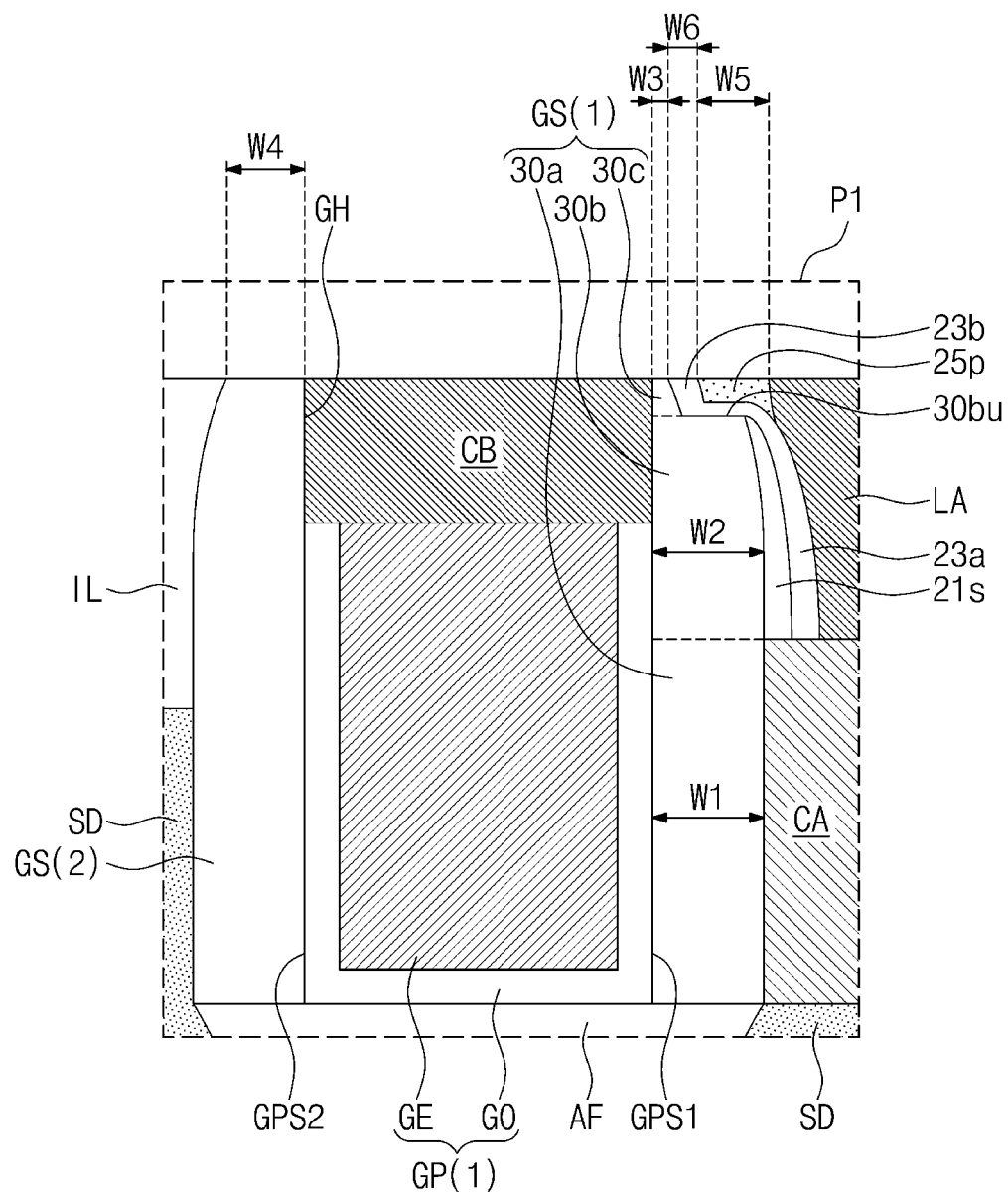
FIG. 2C illustrates an alternate enlarged view of section P1 of FIG. 1B.

FIG. 2A illustrates an enlarged view of section P1 of FIG. 1B. FIG. 2B illustrates a perspective view of section P2 of a first gate pattern depicted in FIG. 1A. FIG. 2C illustrates an alternate enlarged view of section P1 of FIG. 1B.

Referring to FIGS. 1A, 1B, 2A, and 2B, the gate patterns GP may each include a first sidewall GPS1 and a second sidewall GPS2 that are opposite to each other. The gate spacers GS may include a first gate spacer GS(1) that covers the first sidewall GPS1 and a second gate spacer GS(2) that covers the second sidewall GPS2. The first gate spacer GS(1) may have a cross-section whose shape is the same as or different from that of a cross-section of the second gate spacer GS(2).

In an implementation, referring to FIGS. 2A and 2B, the first gate spacer GS(1) that covers the first sidewall GPS1 of the first gate pattern GP(1) may have a different shape from that of the second gate spacer GS(2) that covers the second sidewall GPS2 of the first gate pattern GP(1). The first gate spacer GS(1) may be partially recessed at an upper portion thereof. In an implementation, the first gate spacer GS(1) may have a spacer recess region R2 at the upper portion of the first gate spacer GS(1). In an implementation, the first gate spacer GS(1) may include a first segment 30a between the gate electrode GE and the contact pad CA, a second segment 30b between the gate electrode GE and the source/drain contact LA, and a third segment 30c on the second segment 30b. The first, second, and third segments 30a, 30b, and 30c may be integrally connected to each other to constitute the first gate spacer GS(1).

The first segment 30a may have a first width W1. The second segment 30b may have a second width W2 (e.g., as measured in the same direction as the first width W1). The second width W2 at a lower portion of the second segment 30b may be the same as the first width W1, and may increase with increasing distance upwardly away from the lower portion of the second segment 30b. The third segment 30c may have a third width W3 (e.g., as measured in the same direction as the first width W1), and the third width W3 may be less than the first width W1 and the second width W2. In an implementation, the third segment 30c may not expose, e.g., may cover, a portion of a top surface 30bu of the second segment 30b. The spacer recess region R2 may have a bottom surface that corresponds to the top surface 30bu of the second segment 30b. The spacer recess region R2 may have a sidewall that corresponds to that of the third segment 30c.

The spacer recess region R2 may not be on or in the second gate spacer GS(2) that covers the second sidewall GPS2 of the first gate pattern GP(1). The second gate spacer GS(2) may have a fourth width W4 (e.g., as measured in the same direction as the first width W1) at a top surface thereof. The fourth width W4 may be greater than the third width W3.

Referring to FIG. 2A, the second segment 30b may have a sidewall covered with the first dielectric spacer 21s. The first dielectric spacer 21s may have a sidewall covered with the second dielectric spacer 23a. The third segment 30c may have a sidewall covered with the third dielectric spacer 23b. The third dielectric spacer 23b may be spaced apart from the first dielectric spacer 21s and the second dielectric spacer 23a. The buried dielectric pattern 25p may be between the third dielectric spacer 23b and the source/drain contact LA. The buried dielectric pattern 25p may cover top ends (e.g., ends of the first and second dielectric spacers 21s and 23a distal to the substrate 1) of the first and second dielectric spacers 21s and 23a. The buried dielectric pattern 25p may cover the top surface 30bu of the second segment 30b and a lateral surface of the third dielectric spacer 23b.

In an implementation, as shown in FIG. 2C, the second dielectric spacer 23a and the third dielectric spacer 23b may be integrally connected to each other. A lower portion of the second dielectric spacer 23a or an upper portion of the third dielectric spacer 23b may extend between the second segment 30b and the buried dielectric pattern 25p, and may contact (e.g., directly contact) the top surface 30bu of the second segment 30b.

The third dielectric spacer 23b may have a sixth width W6 (or thickness), e.g., in the same direction in which the first width W1 is measured. The buried dielectric pattern 25p may have a fifth width W5 between the third dielectric spacer 23b and the source/drain contact LA, e.g., in the same direction in which the first width W1 is measured. The fifth width W5 may be greater than the sixth width W6. Each of the first, second, and fourth dielectric spacers 21s, 23a, and 23c may have a width (e.g., maximum thickness) the same as or similar to the sixth width W6.

Referring back to FIGS. 1A and 1B, the gate spacers GS that cover opposite sidewalls of the second gate pattern GP(2) may have their shapes the same as that of the first gate spacer GS(1) depicted in FIGS. 2A and 2B. When viewed in plan, the buried dielectric pattern 25p may have a closed curve or loop shape or an annular shape that surrounds the source/drain contact LA. The buried dielectric pattern 25p may have a portion, called a dielectric spacer, which is between the third dielectric spacer 23b and the source/drain contact LA.

A semiconductor device according to an embodiment may be configured such that not only the gate spacer GS, but also with the dielectric spacers 21s, 23a, and 23b and the buried dielectric pattern 25p are between the gate contact CB and the source/drain contact LA. An electric short between the source/drain contact LA and one or more of the gate electrode GE and the gate contact CB may be prevented. In an implementation, the buried dielectric pattern 25p and the first dielectric spacer 21s may include materials different from that of the gate spacer GS and different from those of the second and third dielectric spacers 23a and 23b, and a parasitic capacitance may be reduced between the source/drain contact LA and one or more of the gate electrode GE and the gate contact CB, with the result that signal interference may be minimized. As a result, the semiconductor device may increase in reliability.

FIGS. 3A to 15A illustrate plan views of stages in a method of fabricating a semiconductor device having the plan view of FIG. 1A. FIGS. 3B to 15B illustrate cross-sectional views taken along lines A-A', B-B', and C-C' of FIGS. 3A to 15B, respectively.

Figure 3A:
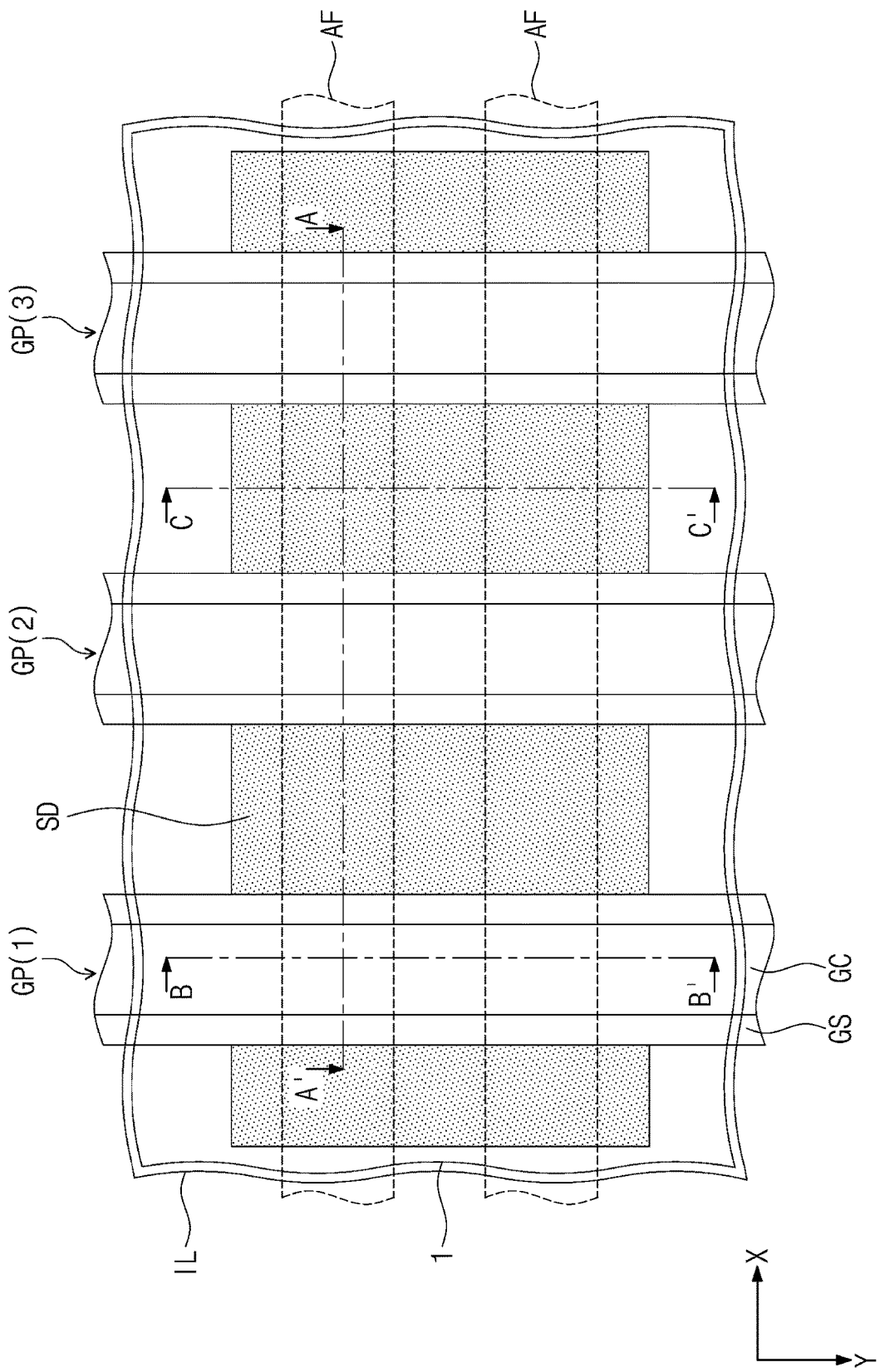
Figure 3B:
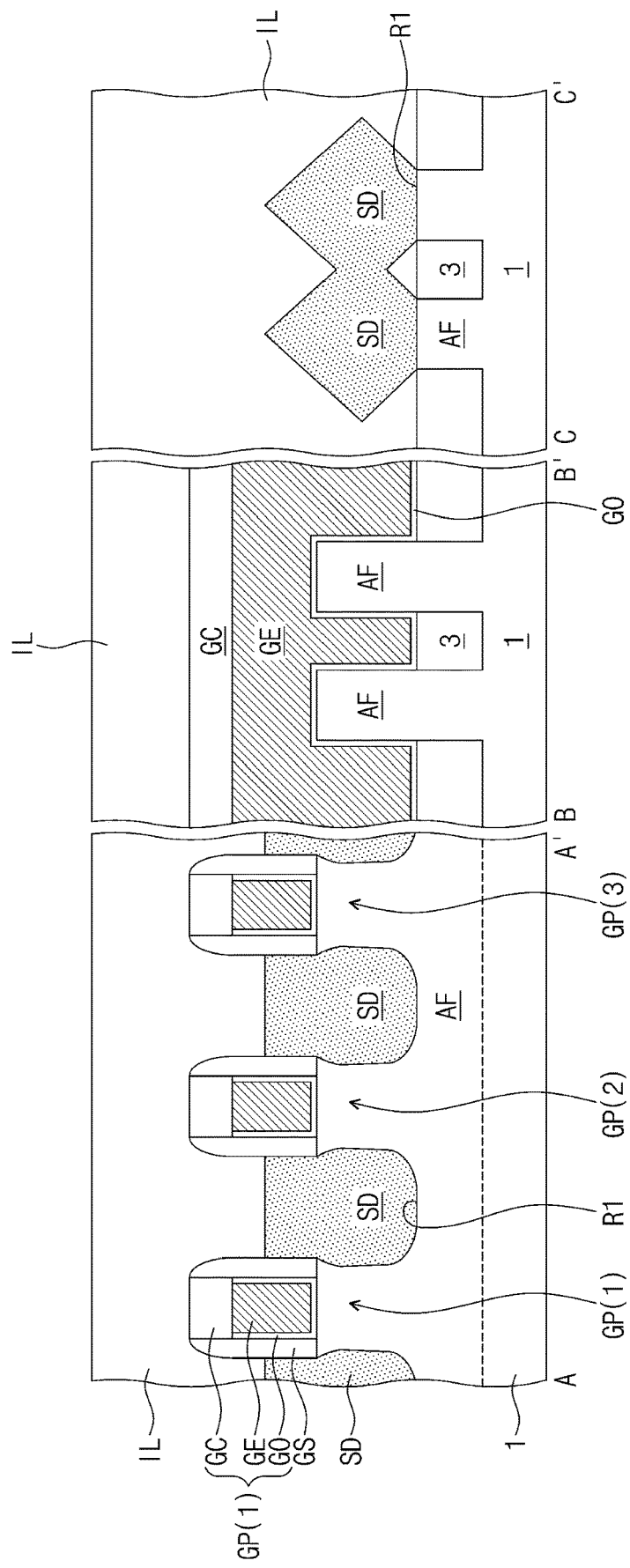

Referring to FIGS. 3A and 3B, a substrate 1 may be etched to form active fins AF from or in the substrate 1. A device isolation layer 3 may be formed on the substrate 1 and on sides of the active fins AF. Dummy gate patterns may be formed to run across the active fins AF, and gate spacers GS may be formed to cover sidewalls of the dummy gate patterns. The active fins AF exposed at sides of the gate spacers GS may be etched to from fin recess regions R1. A selective epitaxial growth process and an in-situ doping process may be performed to form source/drain patterns SD on corresponding fin recess regions R1. The dummy gate patterns may be removed, and gate patterns GP may be correspondingly formed in locations in which the dummy gate patterns have been removed. The gate patterns GP may include first, second, and third gate patterns GP(1), GP(2), and GP(3). The gate patterns GP may each include a gate dielectric layer GO, a gate electrode GE, and a gate capping pattern GC that are sequentially stacked. An interlayer dielectric layer IL may be formed to cover the gate patterns GP and the source/drain patterns SD. The interlayer dielectric layer IL may include, e.g., tetraethyl orthosilicate (TEOS).

Figure 4A:
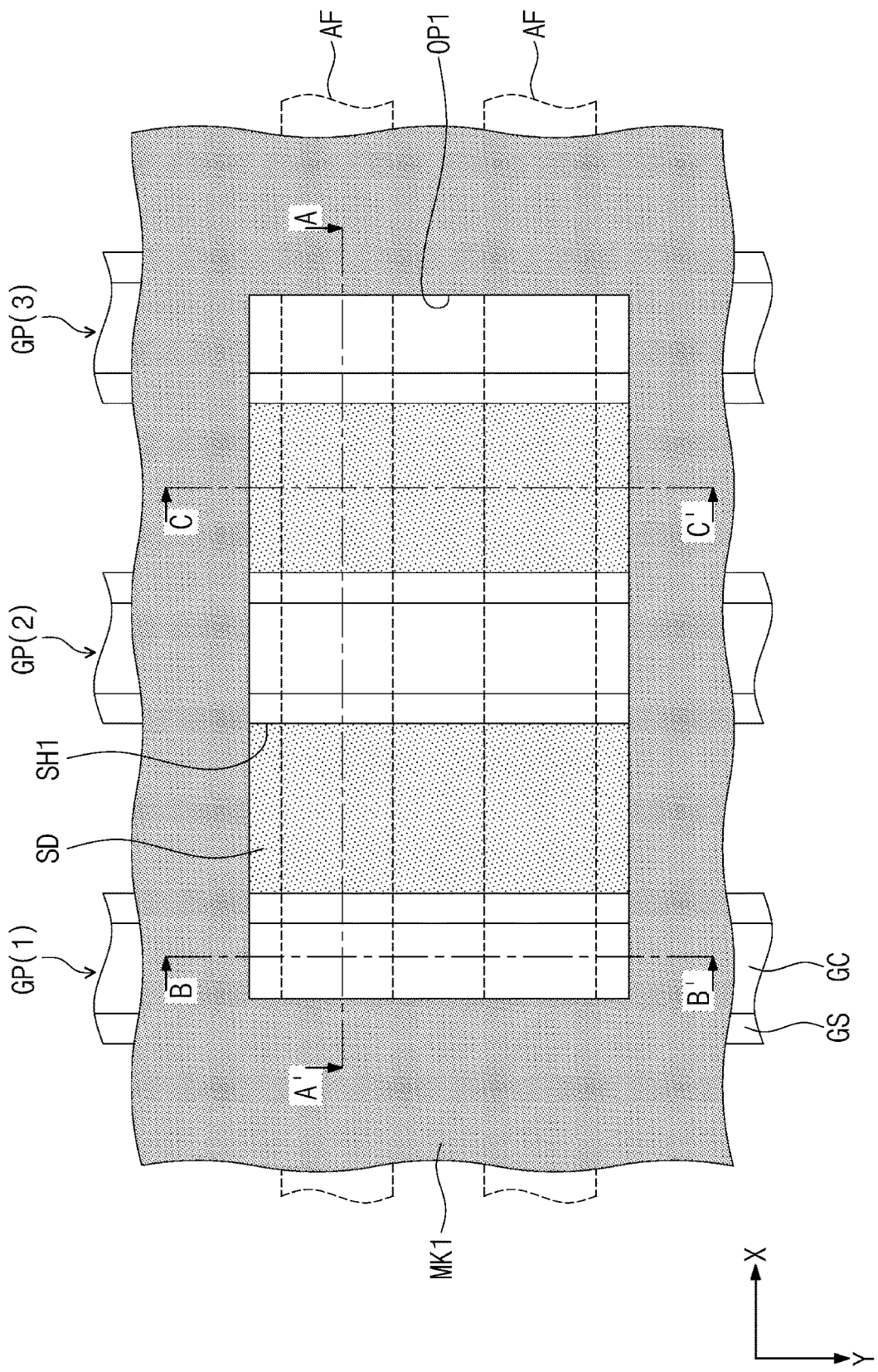
Figure 4B:
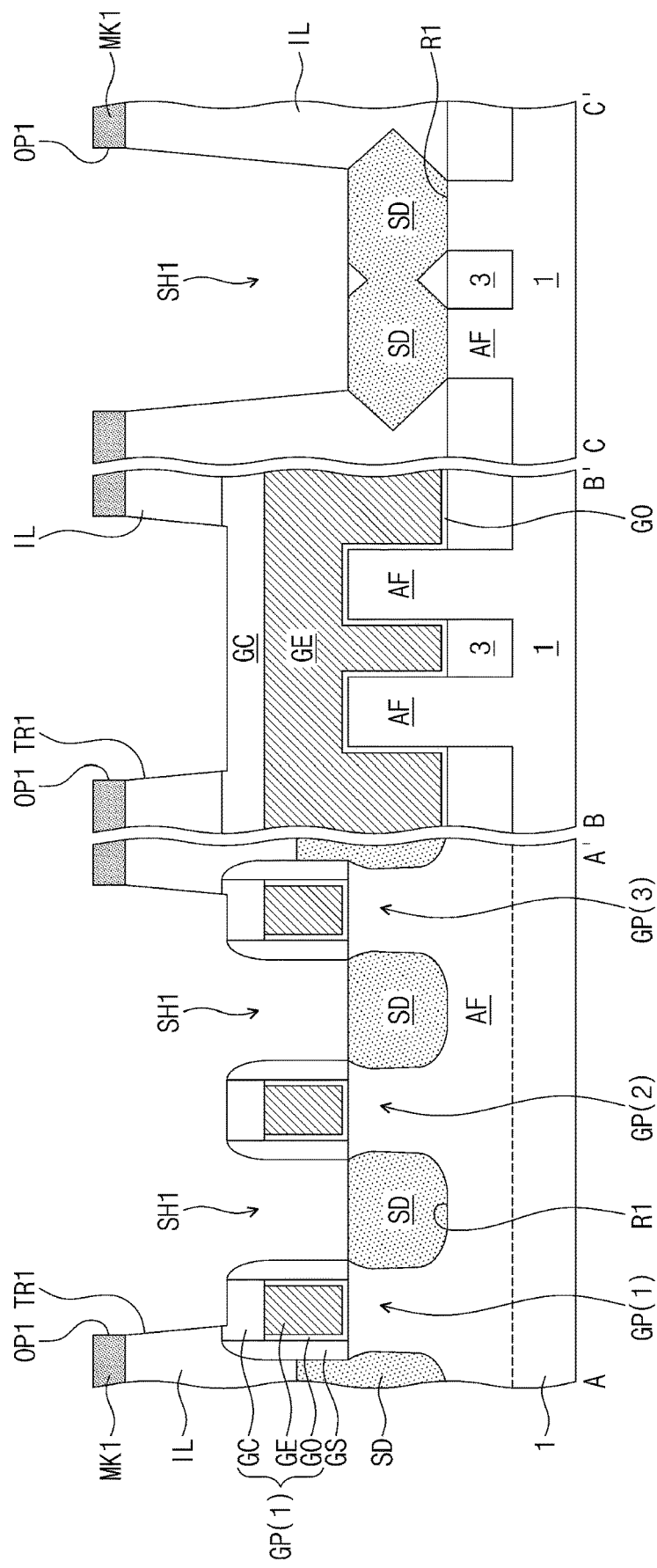
Figure 5A:
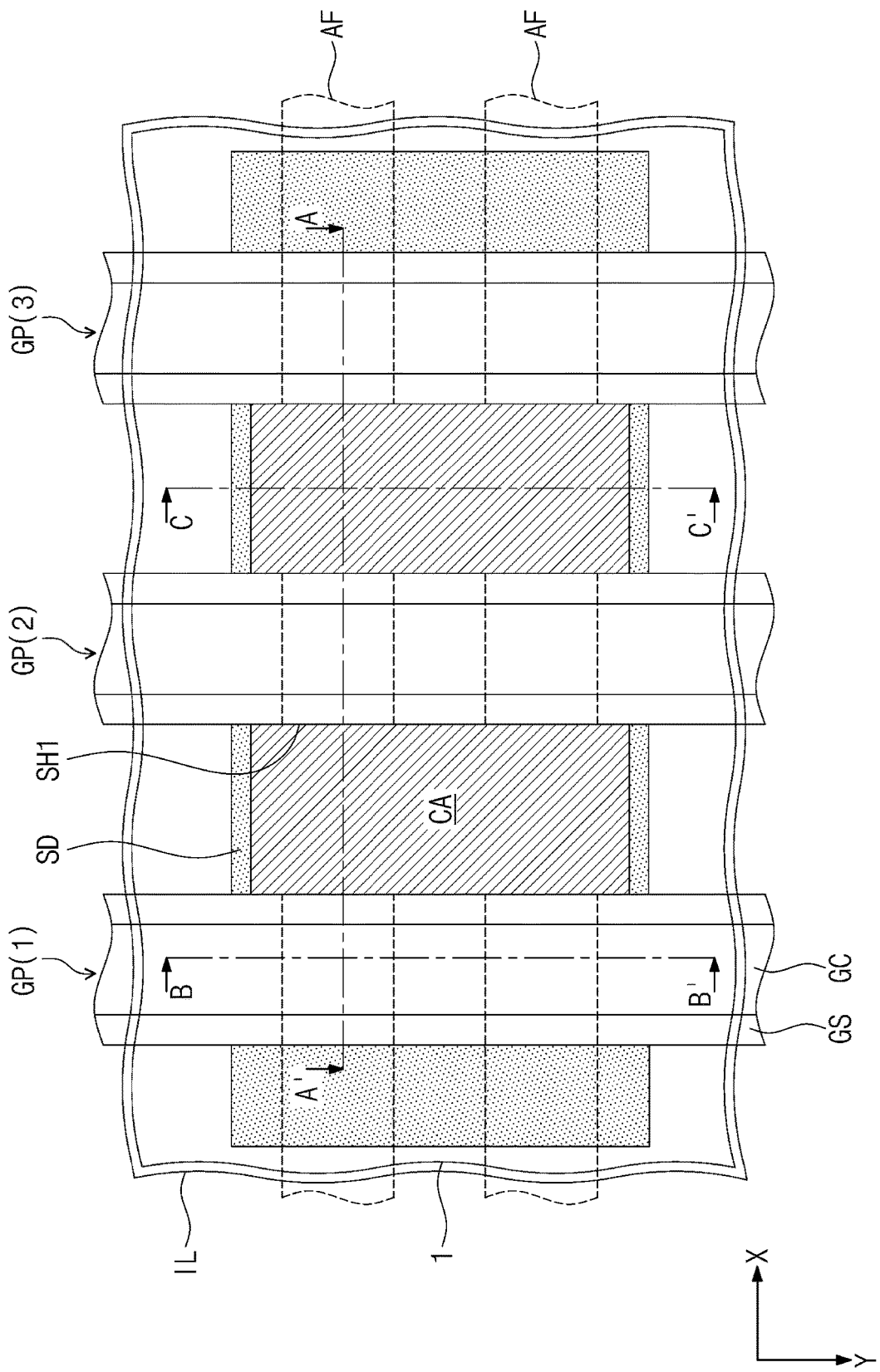
Figure 5B:
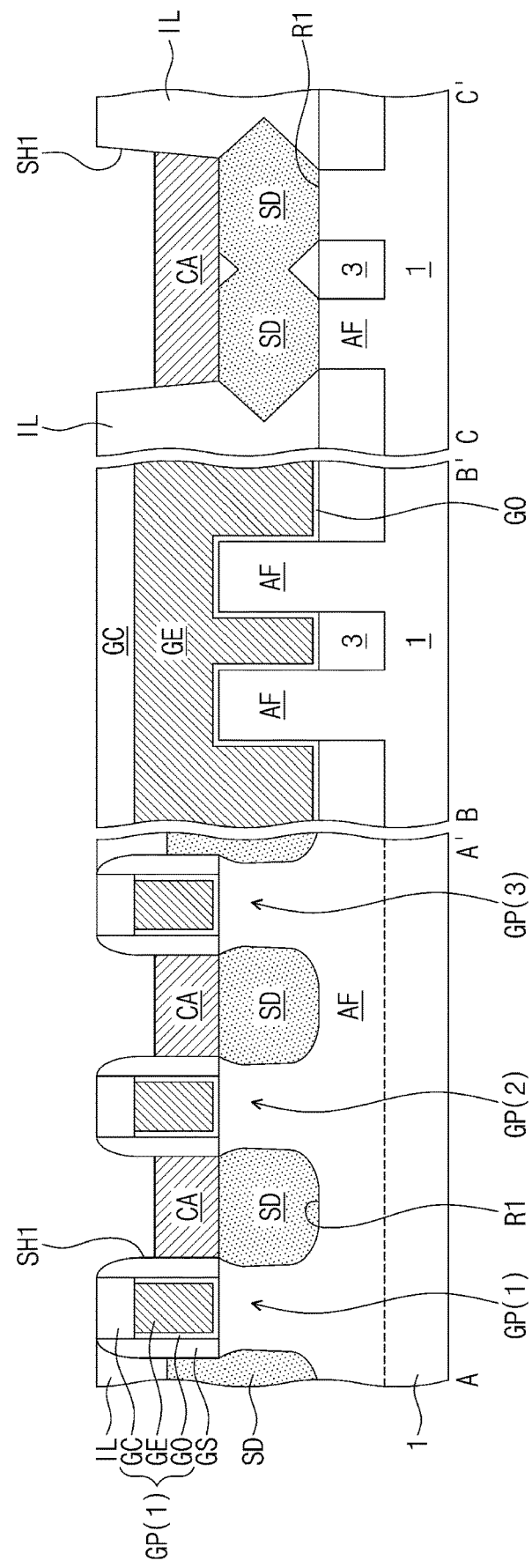
Figure 6A:
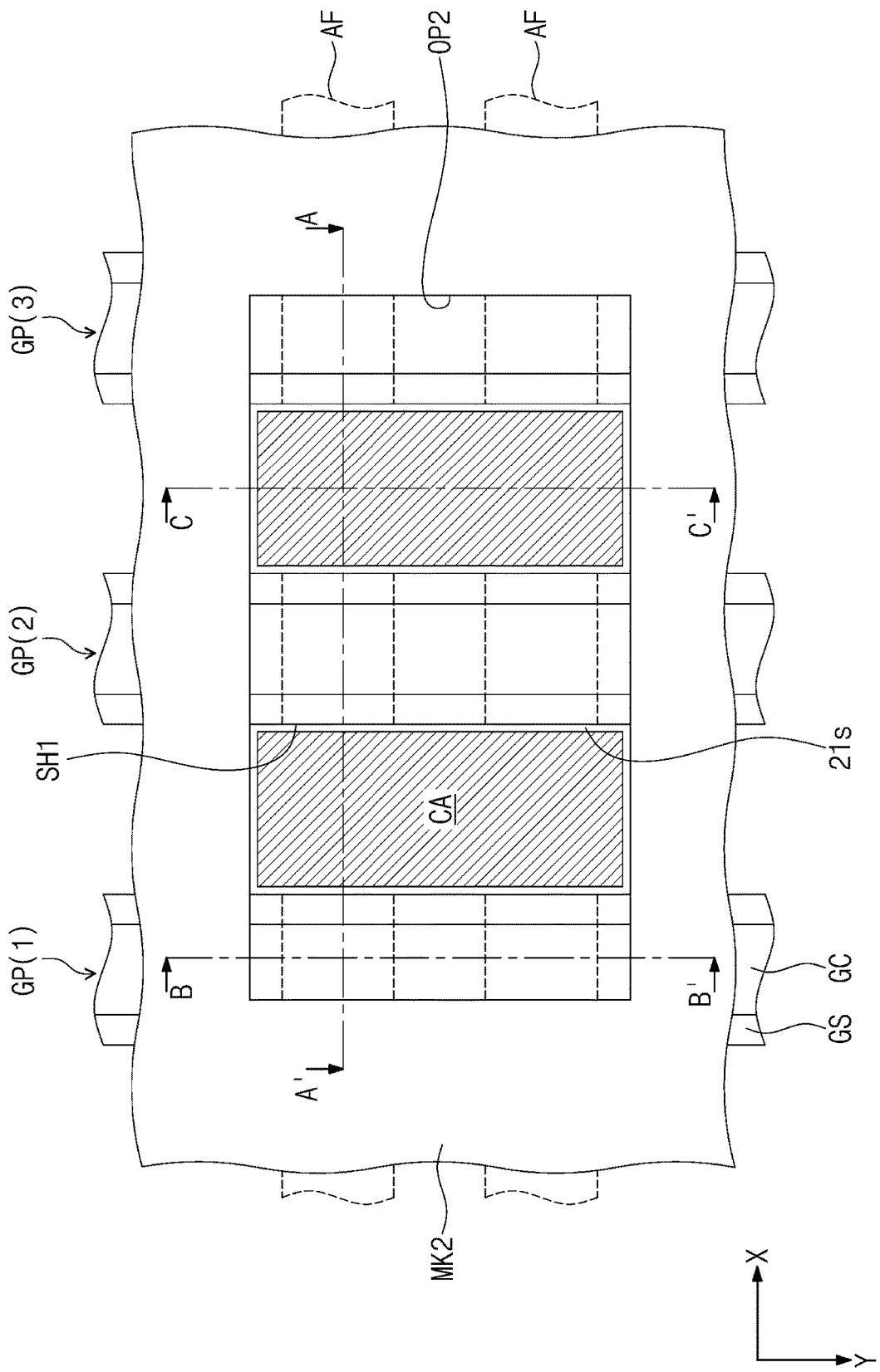
Figure 6B:
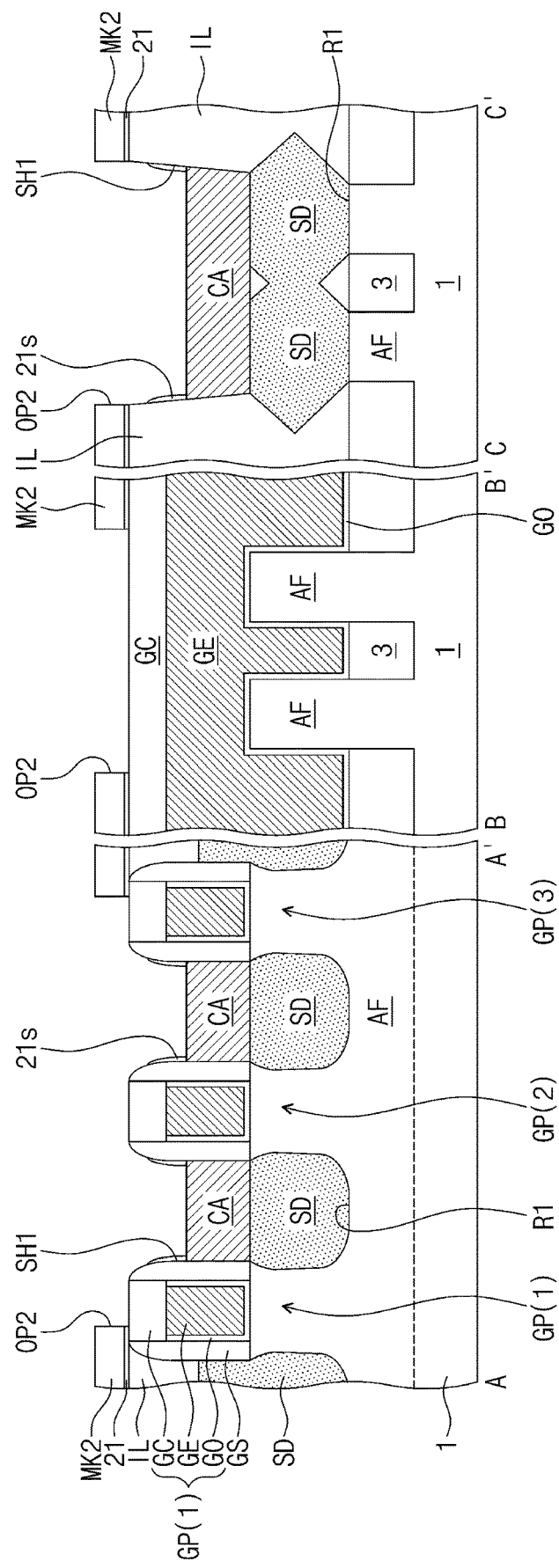
Figure 7A:
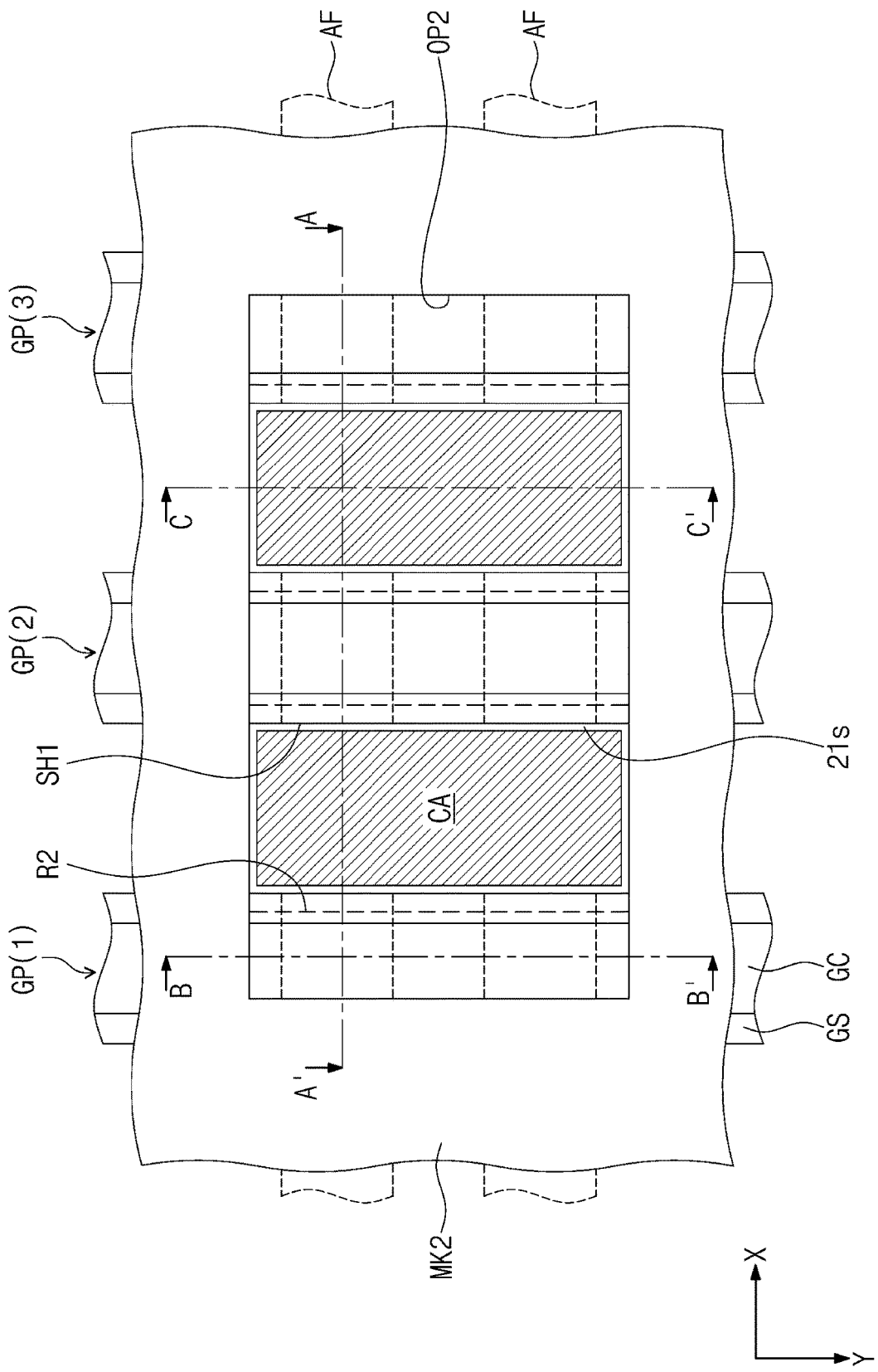
Figure 7B:
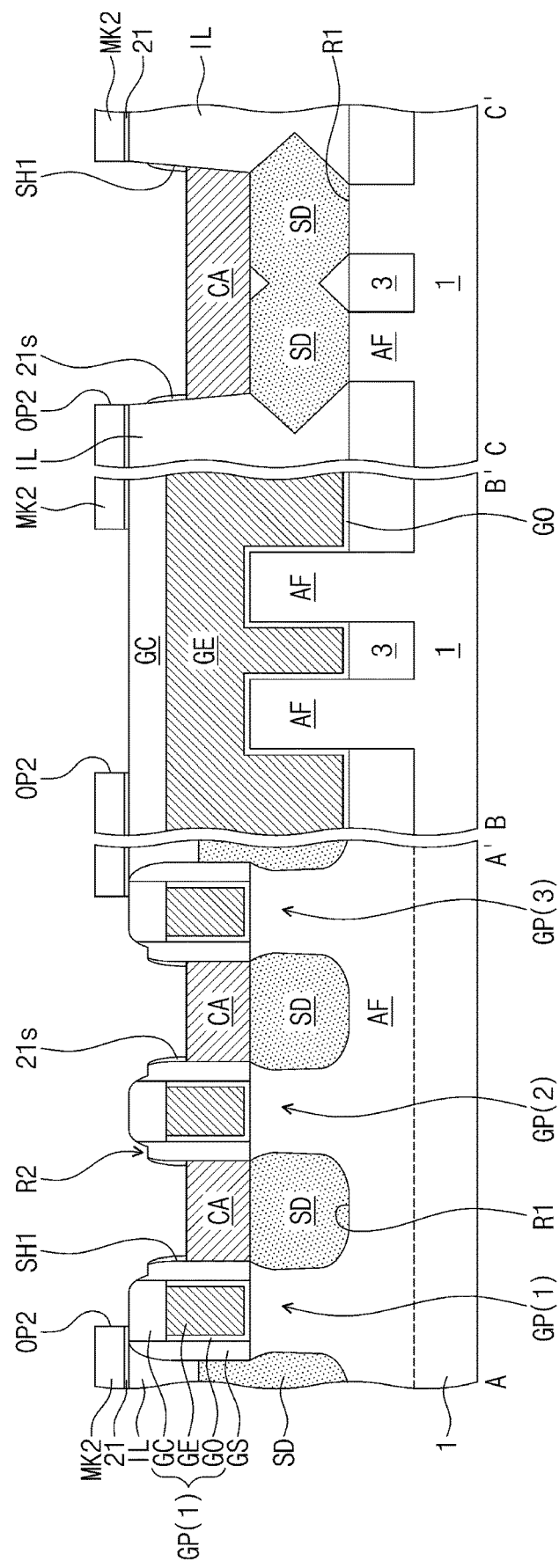
Figure 8A:
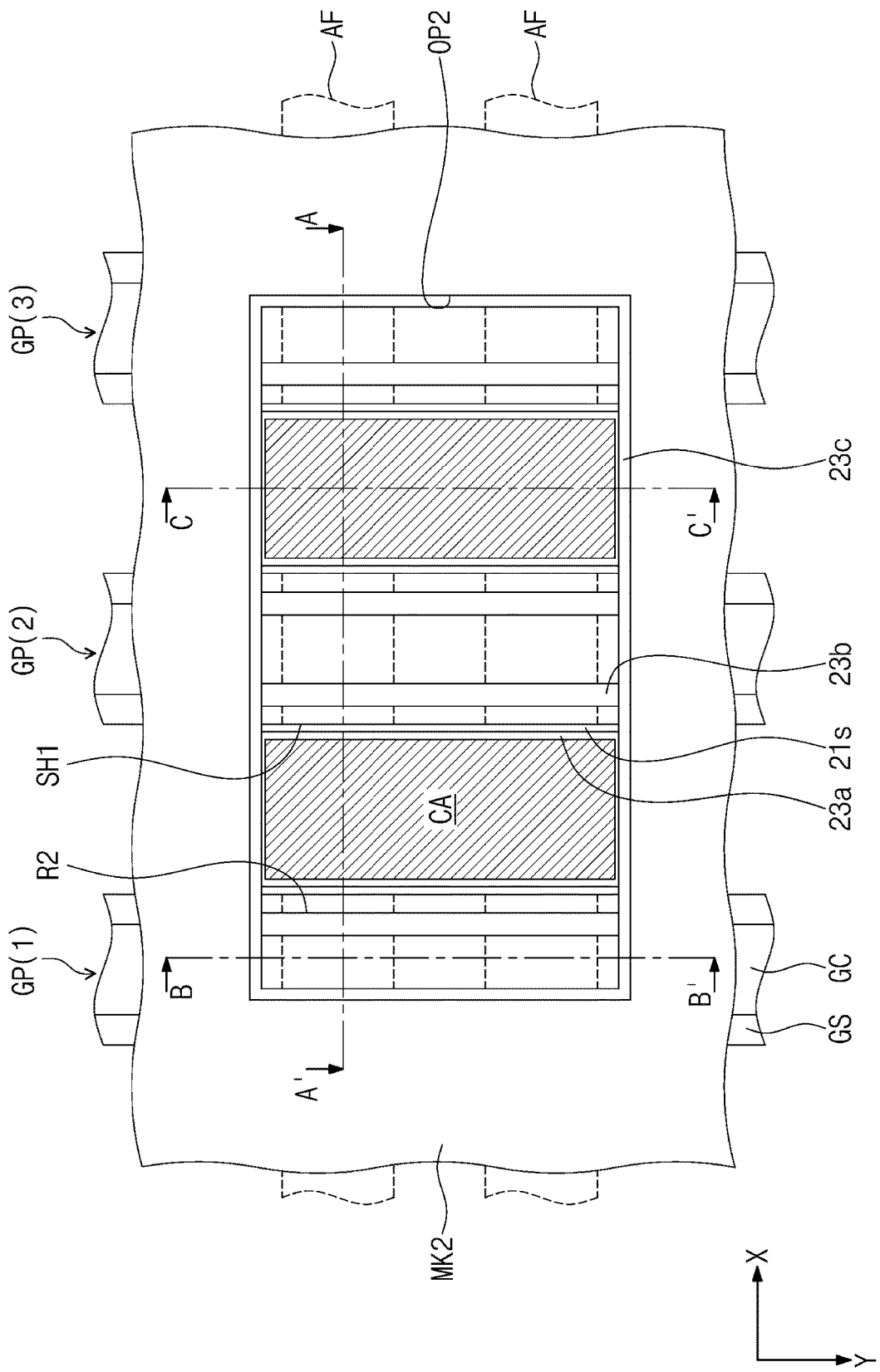
Figure 8B:
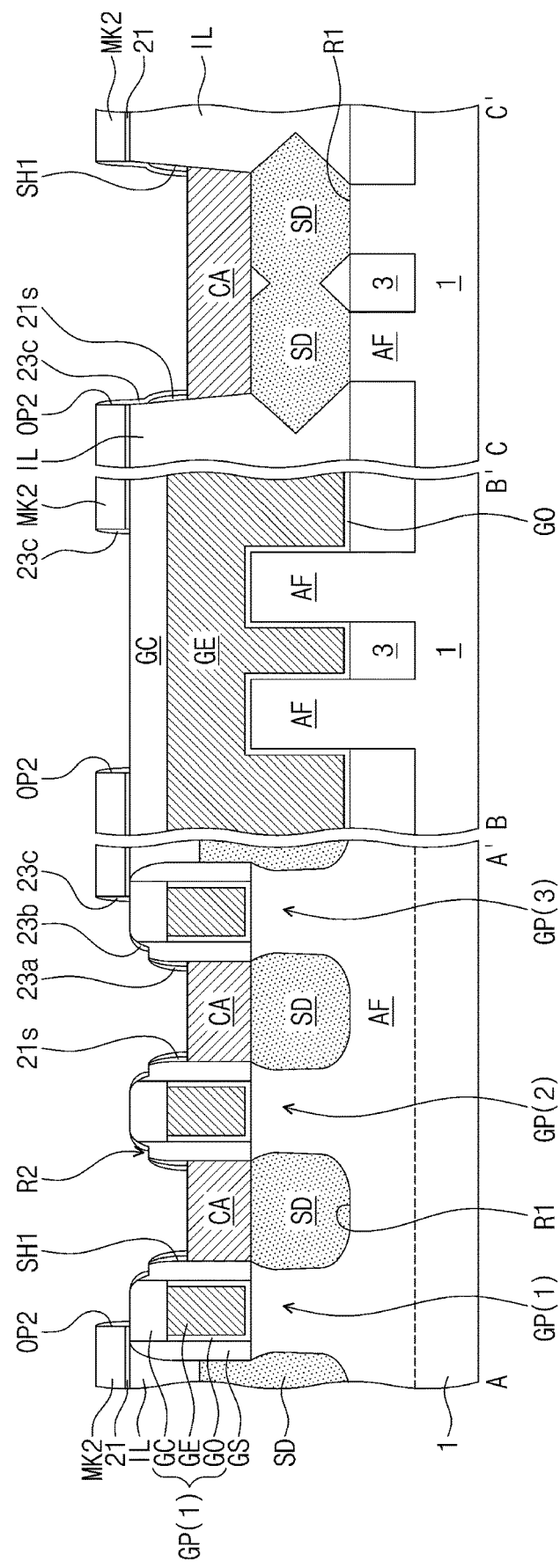
Figure 9A:
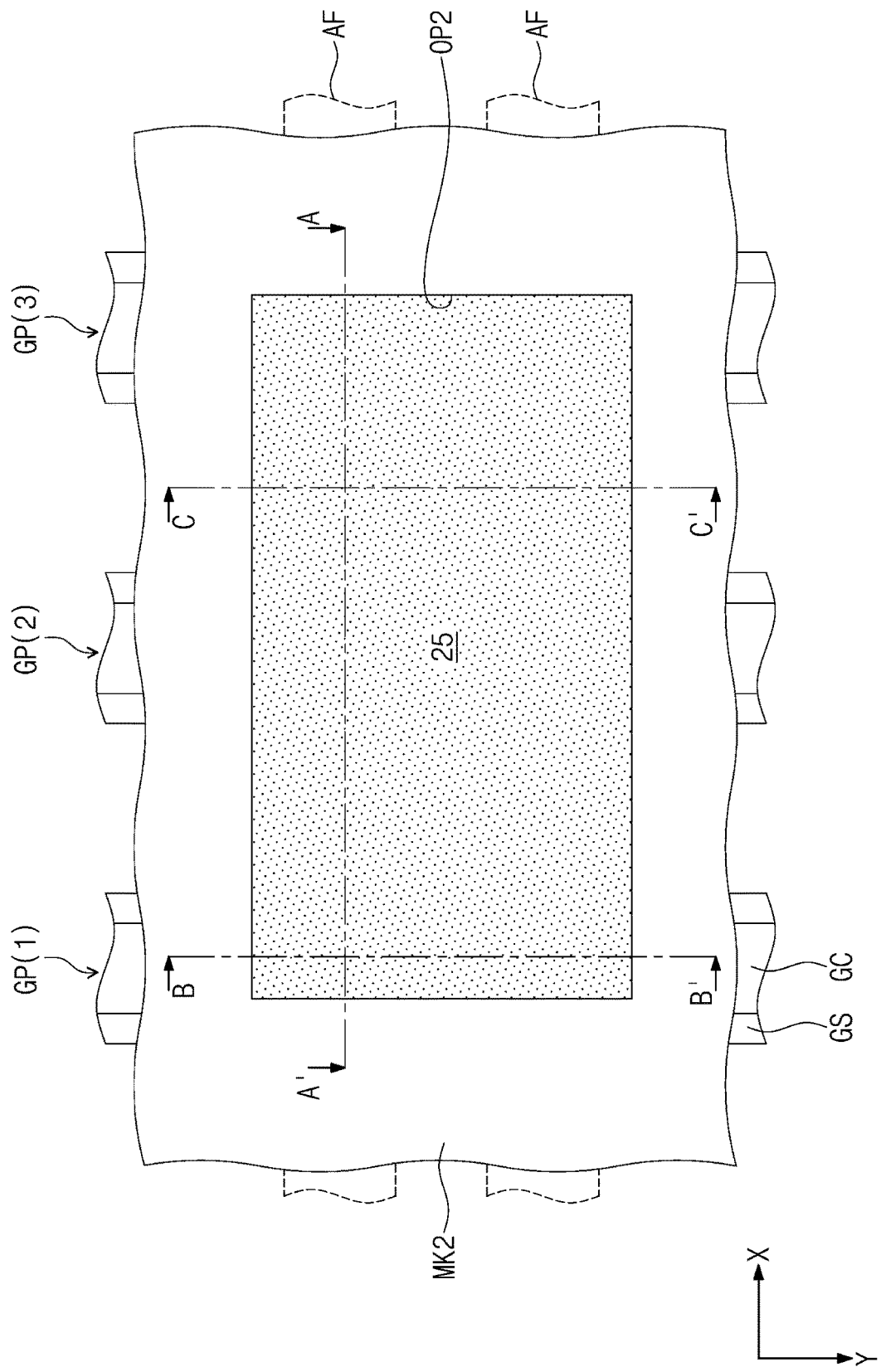
Figure 9B:
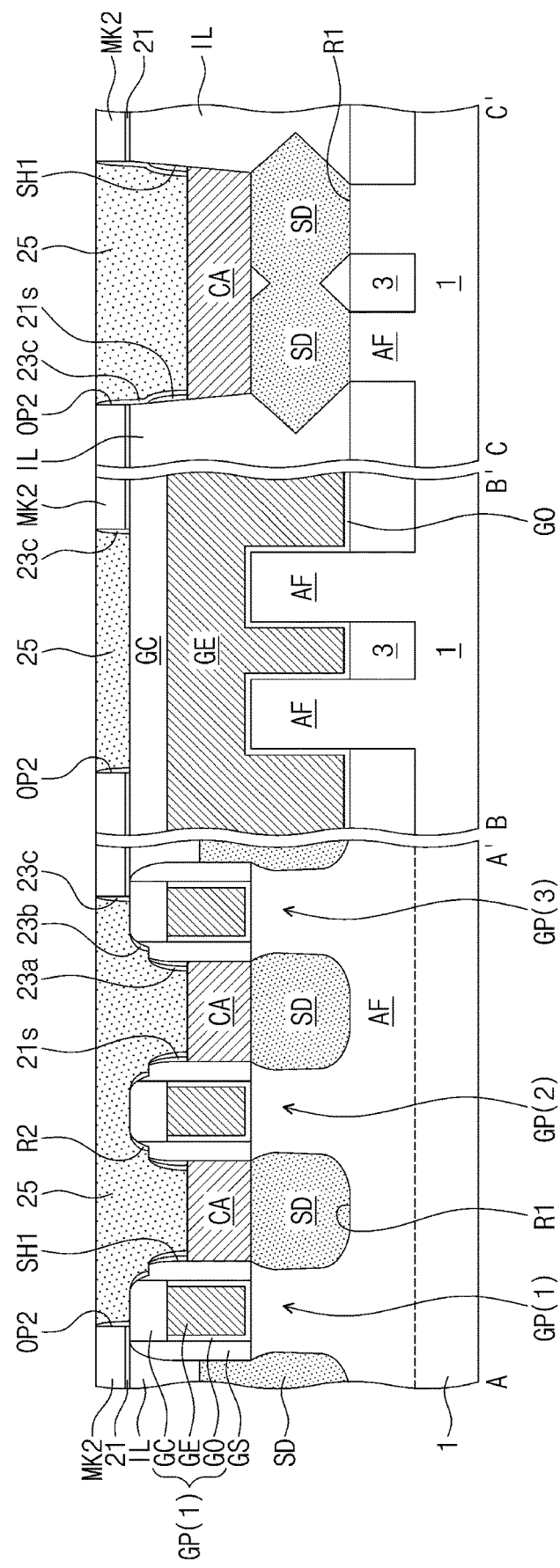
Figure 10A:
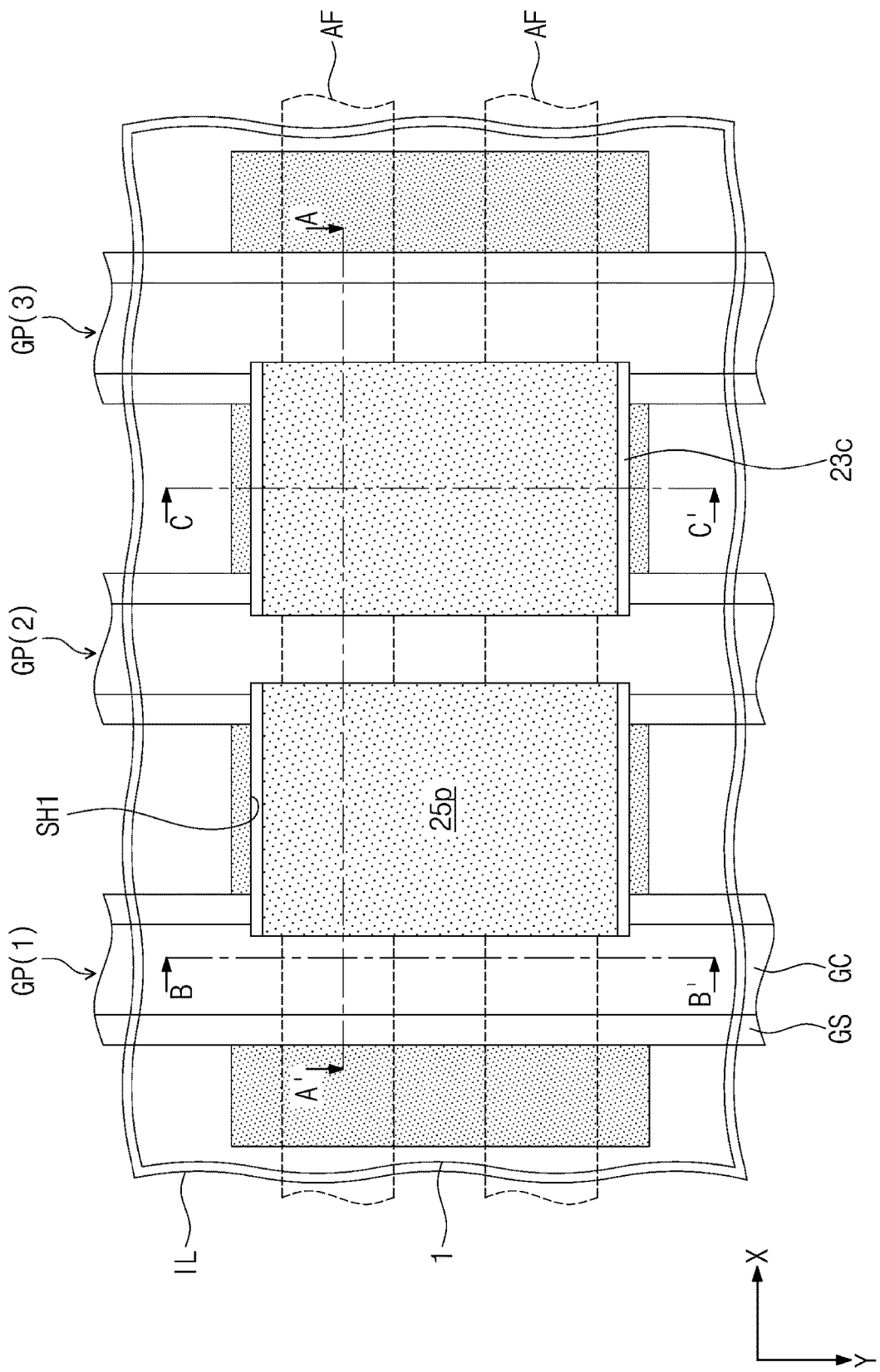
Figure 10B:
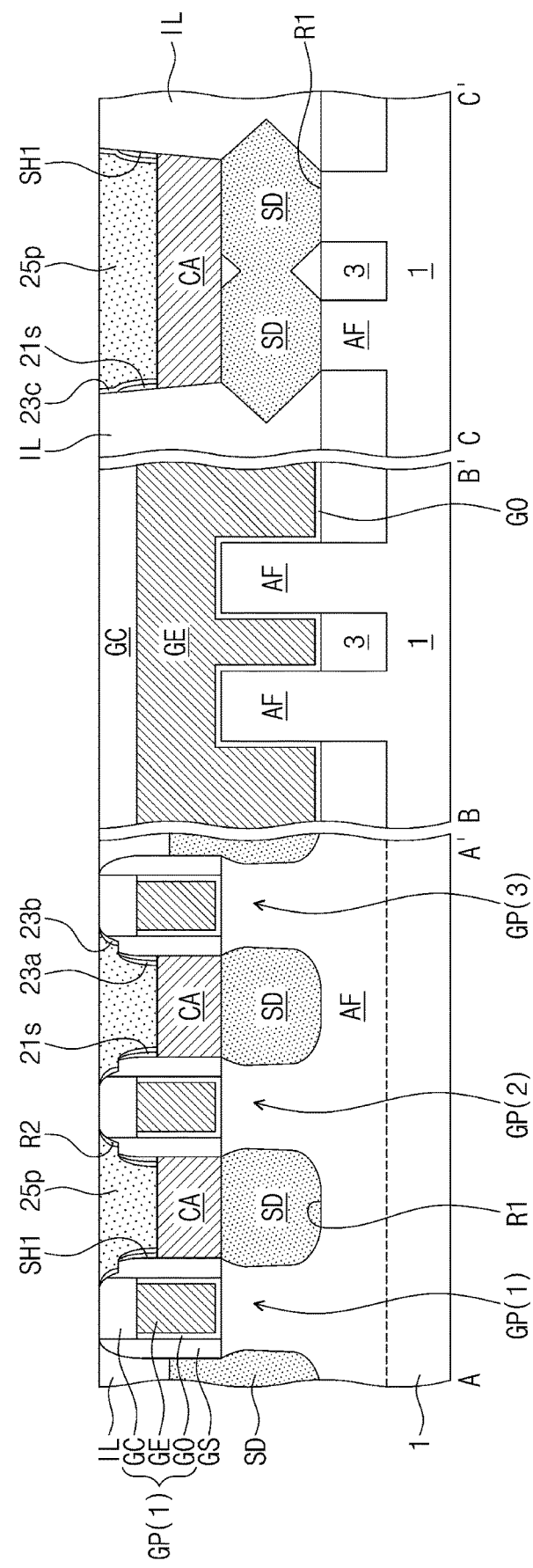
Figure 11A:
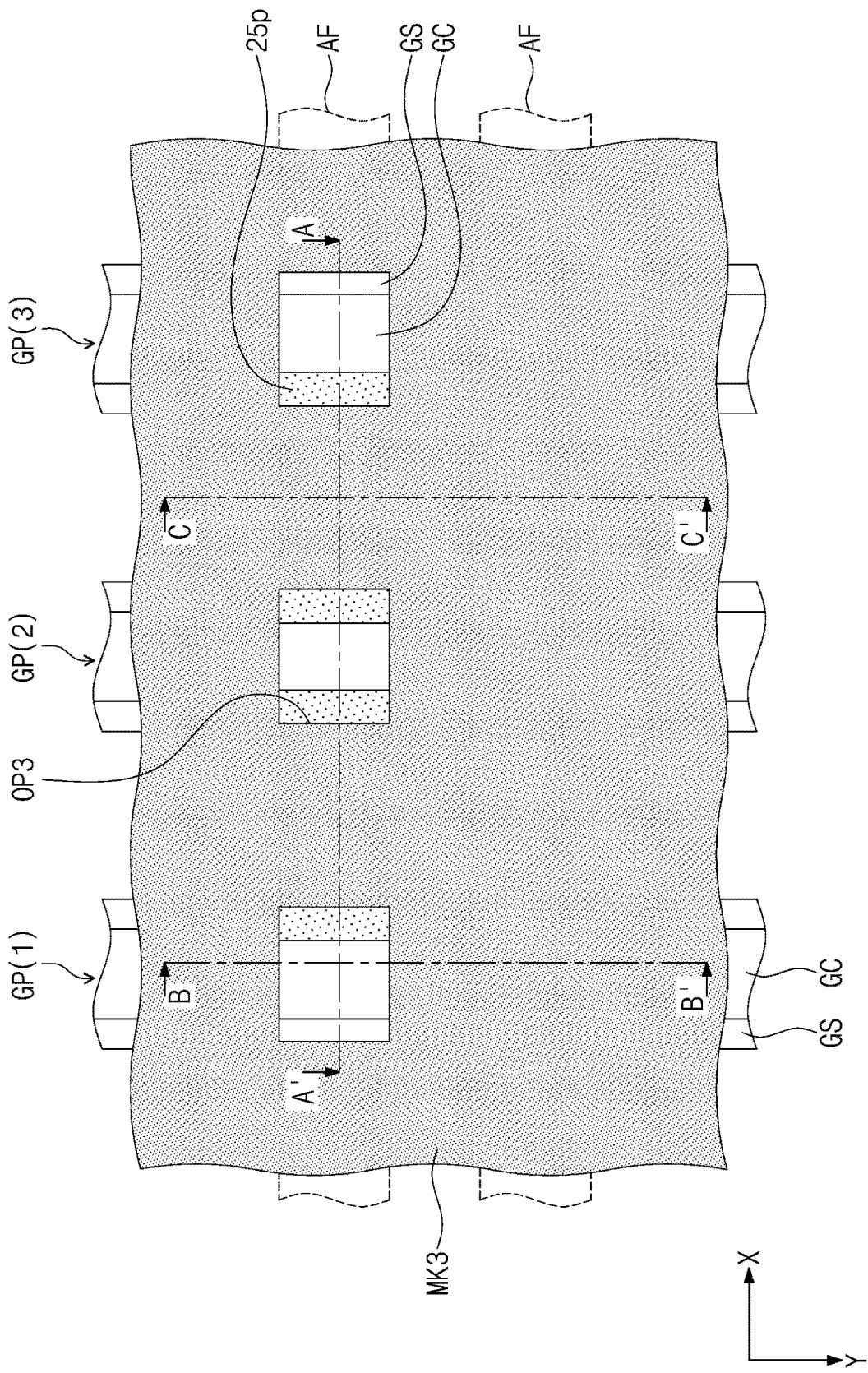
Figure 11B:
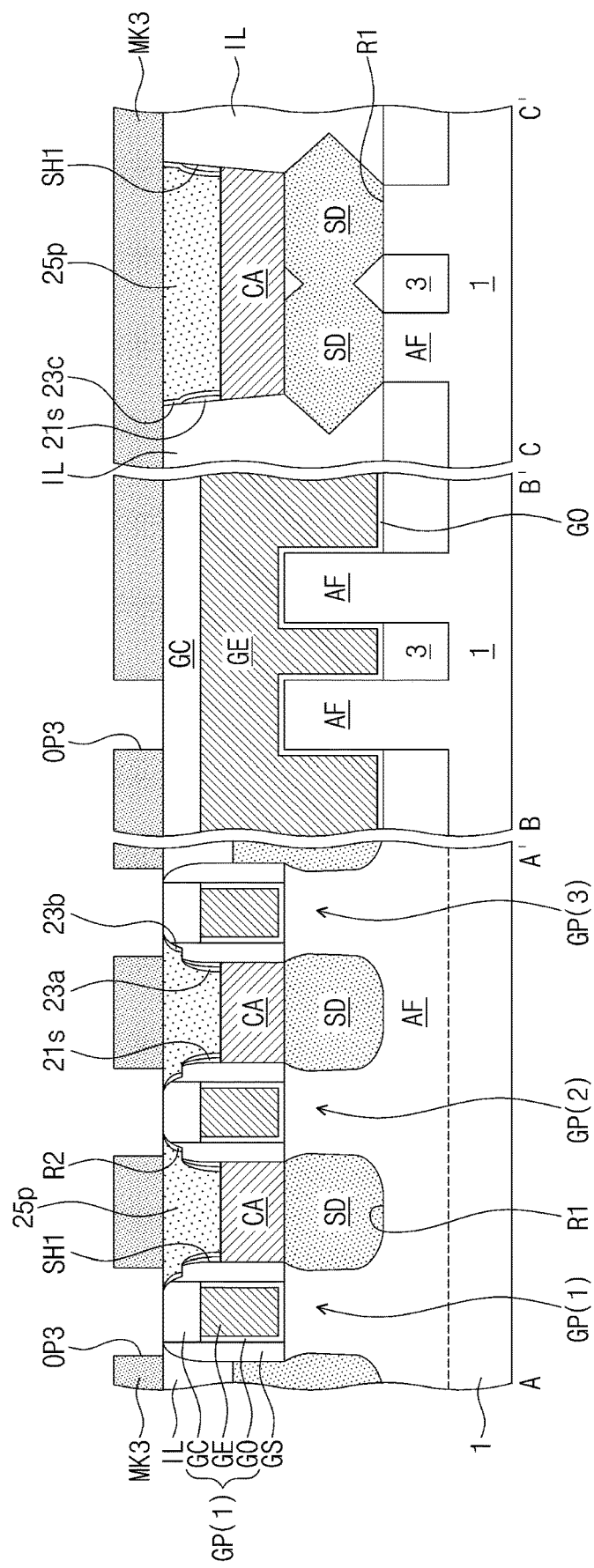
Figure 12A:
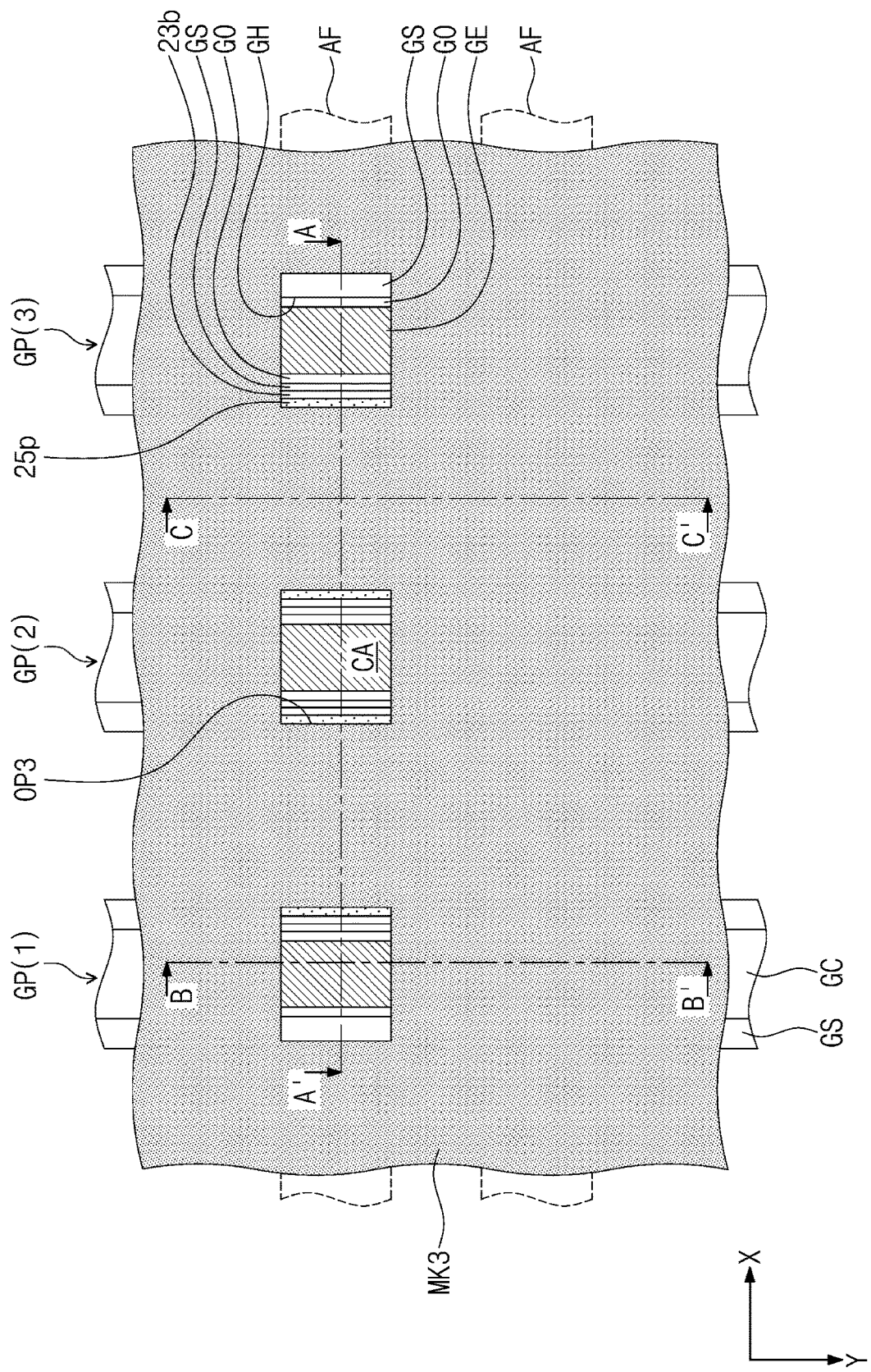
Figure 12B:
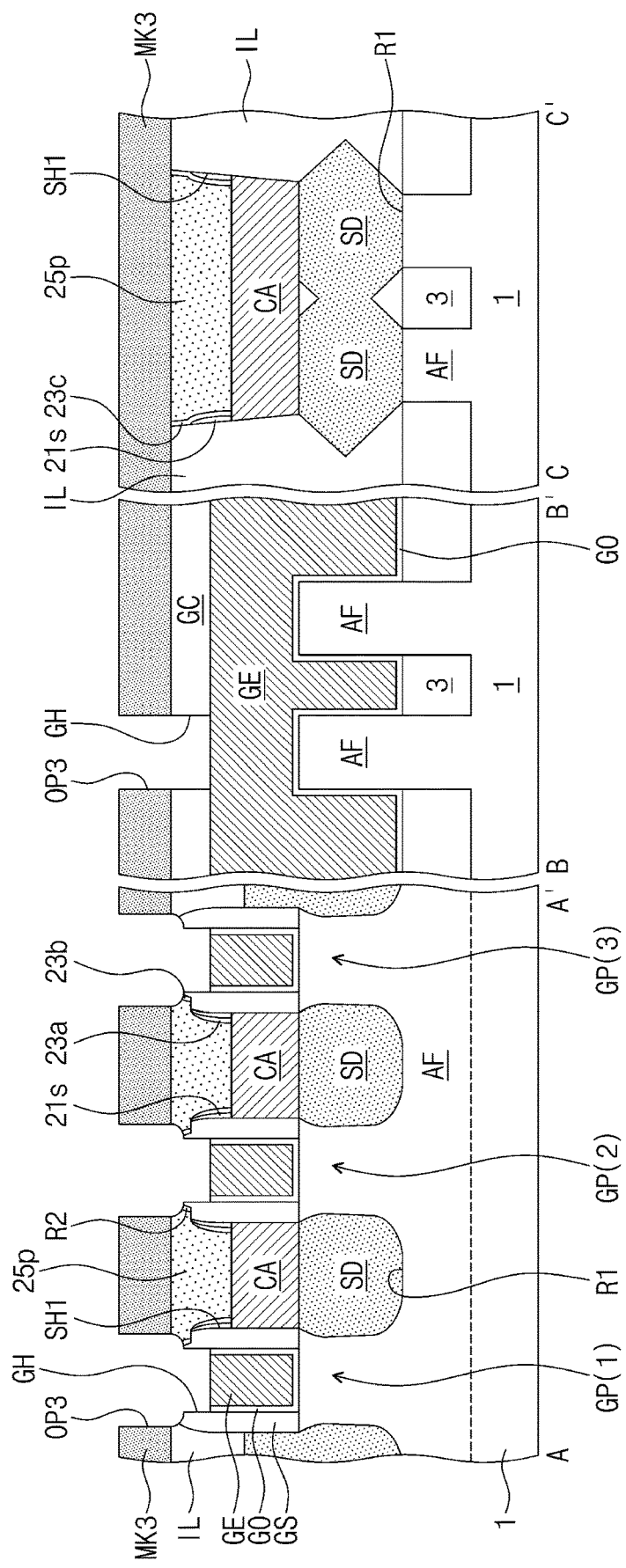
Figure 13A:
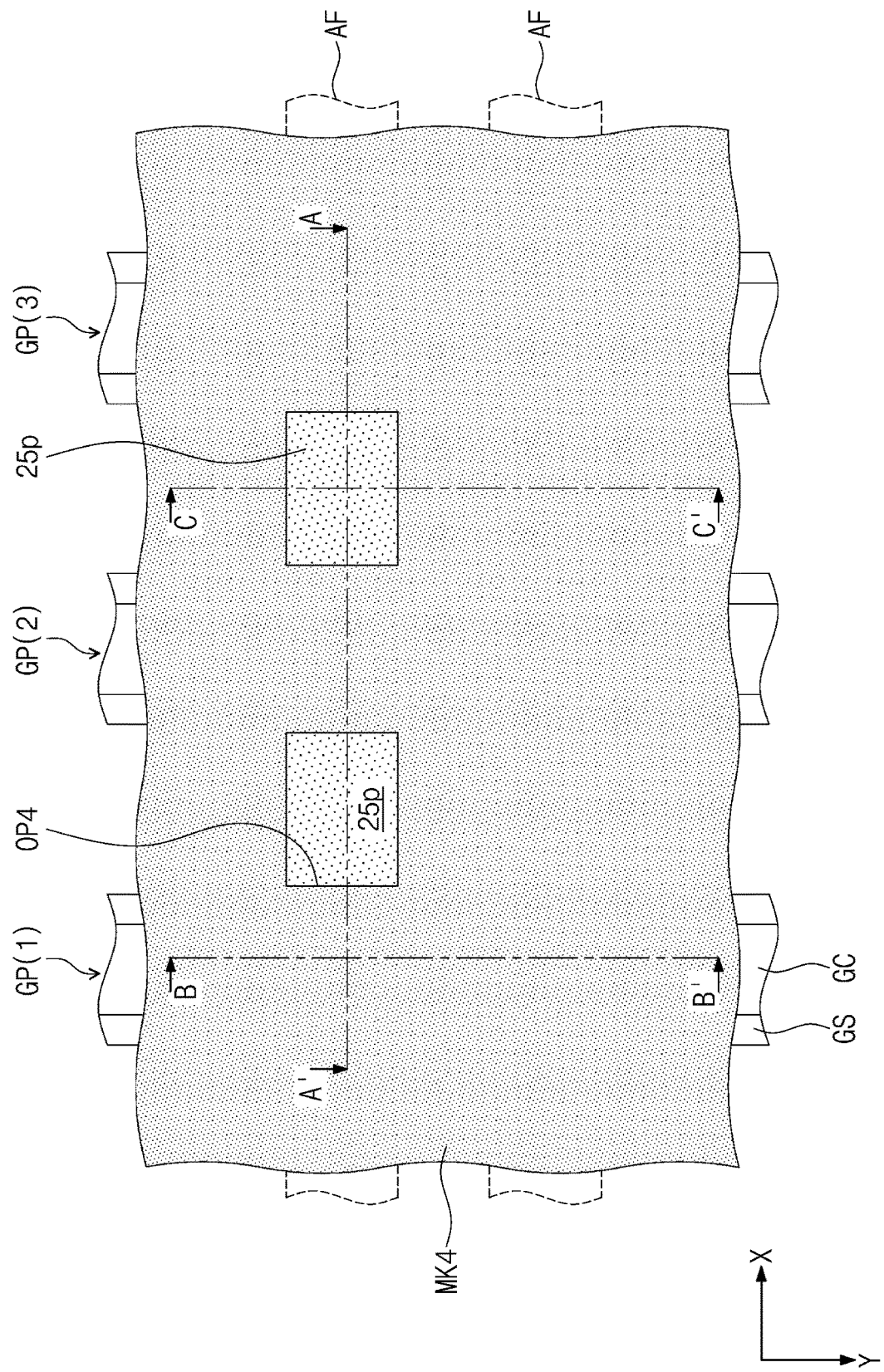
Figure 13B:
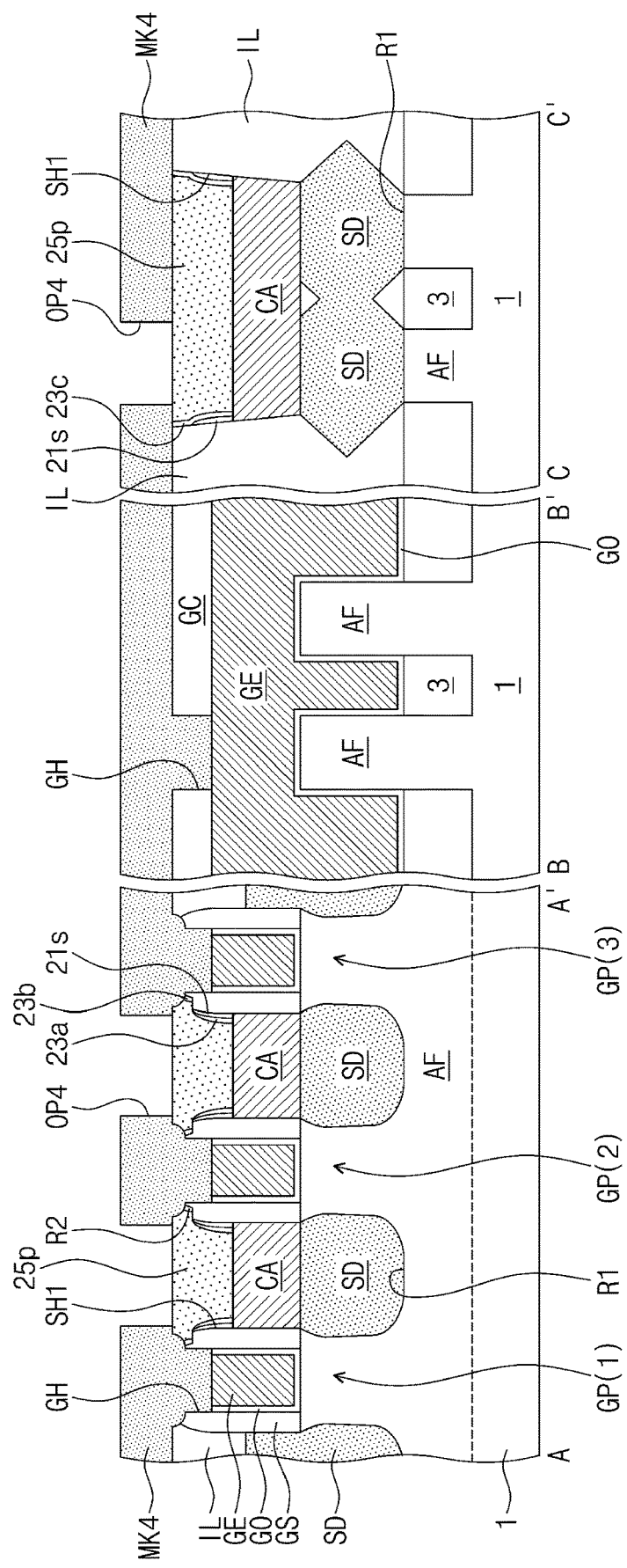
Figure 14A:
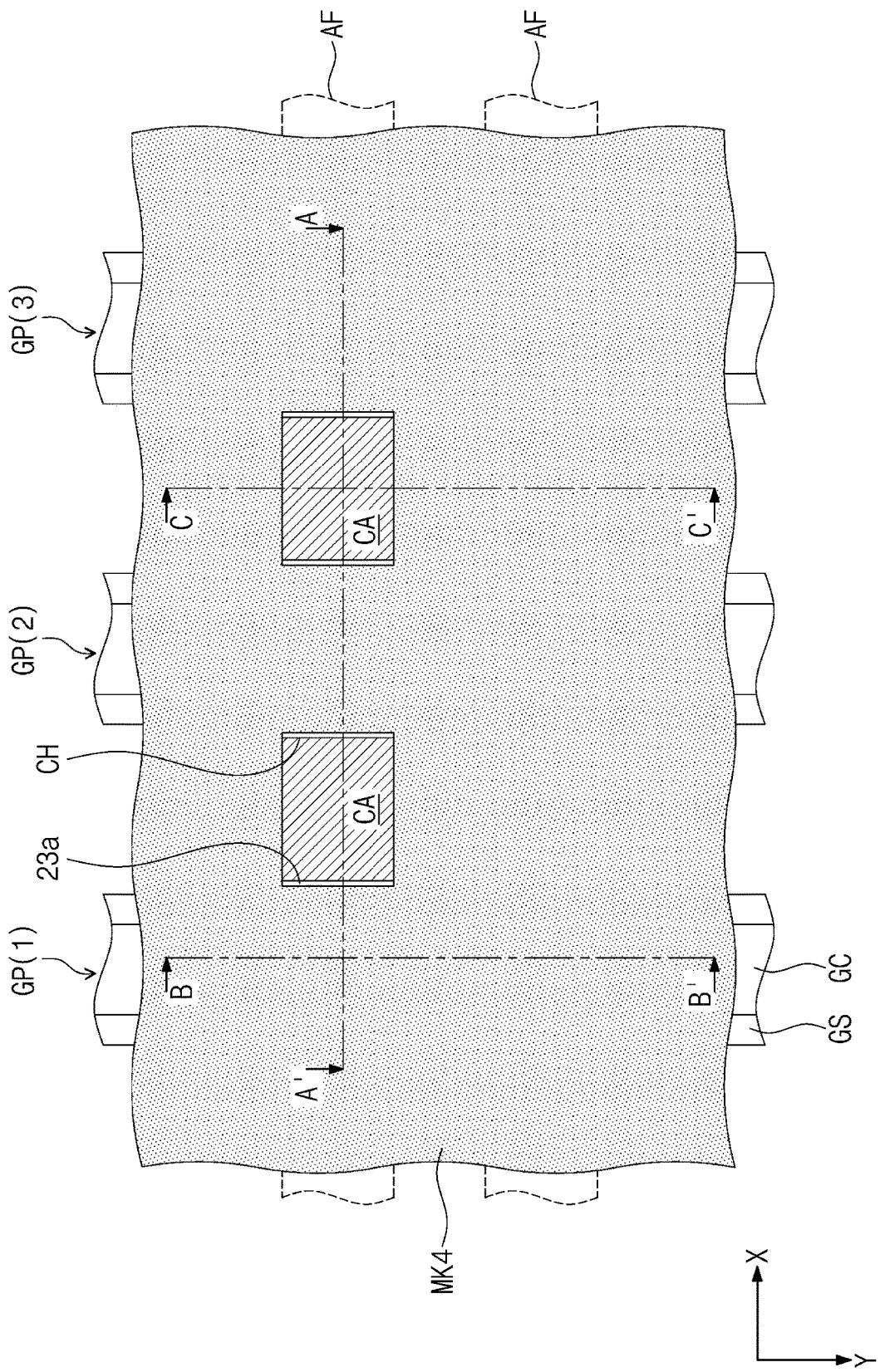
Figure 14B:
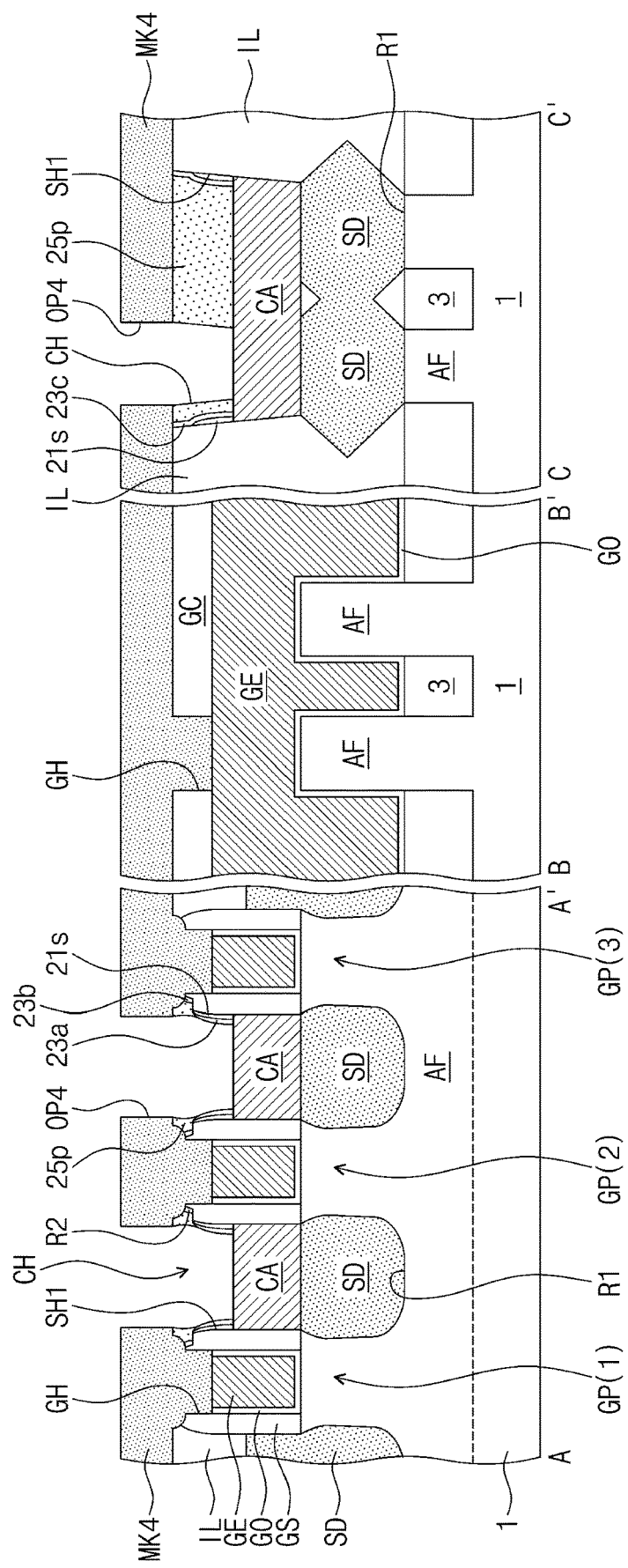
Figure 15A:
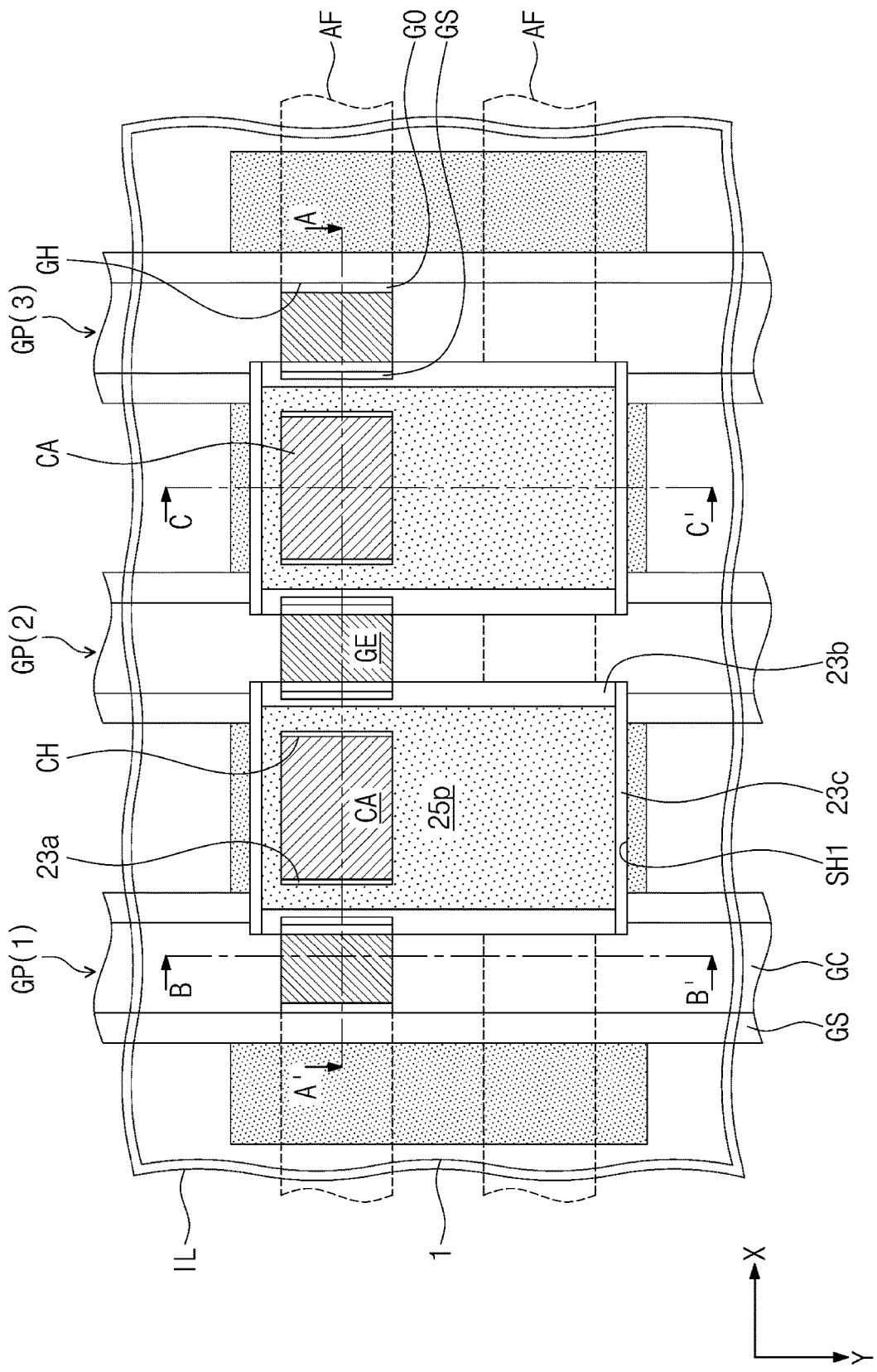
Figure 15B:
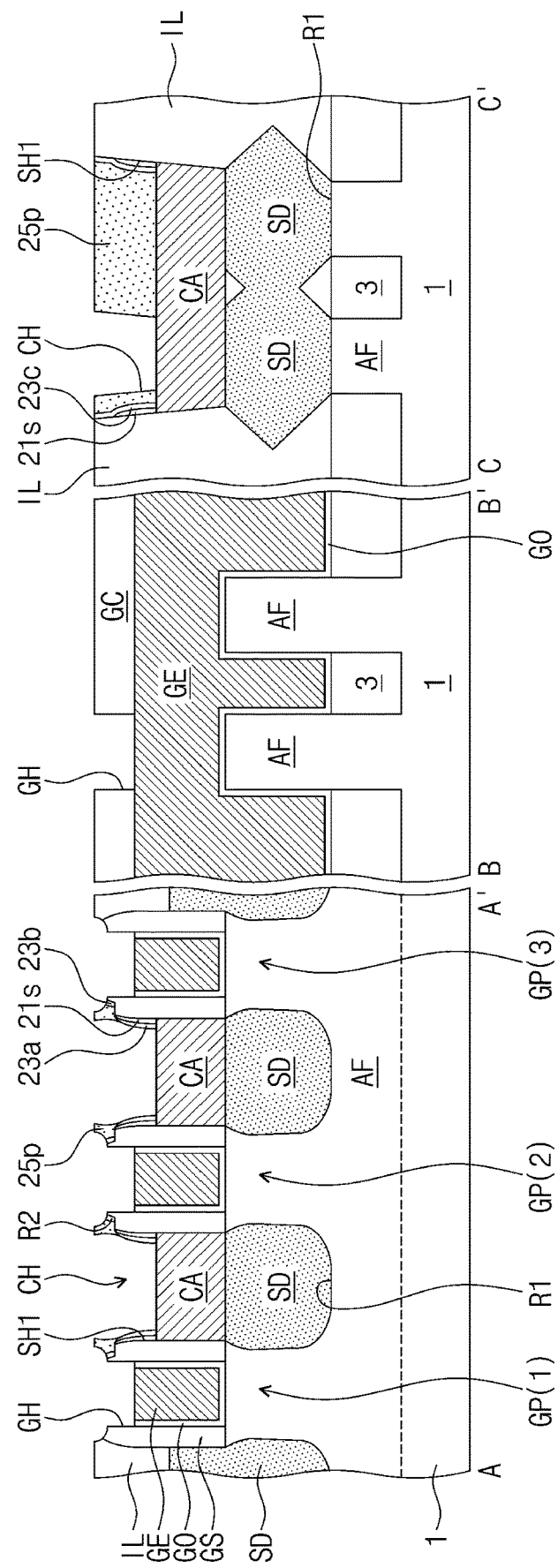

Referring to FIGS. 4A and 4B, a first mask pattern MK1 may be formed on the interlayer dielectric layer IL. The first mask pattern MK1 may have a first opening OP1. The first opening OP1 may be widely formed to overlap at least three gate patterns GP and the source/drain patterns SD between the at least three gate patterns GP. The first mask pattern MK1 may include a material, e.g., photoresist, polysilicon, spin-on-hardmask (SOH), spin-on-carbon (SOC), or amorphous carbon layer (ACL), that have an etch selectivity with respect to the interlayer dielectric layer IL. The first mask pattern MK1 may be used as an etching mask to perform an anisotropic etch process in which the interlayer dielectric layer IL is anisotropically etched to form (on or in the interlayer dielectric layer IL) a first trench TR1 that exposes top surfaces of the gate capping patterns GC and also to form a plurality of pad holes SH1 below or at a bottom of the first trench TR1. The pad holes SH1 may correspondingly expose the source/drain patterns SD between the gate patterns GP. The pad holes SH1 may expose sidewalls of the gate patterns GP. The anisotropic etch process may also etch upper portions of the source/drain patterns SD, as shown in the cross-section of FIG. 4B taken along line C-C'. The pad holes SH1 may be formed in a self-aligned contact (SAC) etching manner.

In the manufacturing of other semiconductor devices, if a first opening of a first mask pattern were to be formed to have a plurality of small holes that correspondingly overlap source/drain patterns, and if the first mask pattern were to be used to perform an etch process, a first trench may not be formed, and only pad holes may be formed between gate patterns. For example, a portion of an interlayer dielectric layer could remain on a second gate pattern. In such a process, a reduction in an interval between the gate patterns could increase the occurrence of not-open of pad holes.

In contrast, according to an embodiment, because the first opening OP1 may be widely formed and the interlayer dielectric layer IL may be formed to have the first trench TR1 partially connecting the pad holes SH1, an etchant may be satisfactorily supplied when the pad holes SH1 are formed, which may help reduce the occurrence of not-open of the pad holes SH1. According to an embodiment, process defects may be reduced to increase a yield and to improve reliability of semiconductor devices.

Referring to FIGS. 4A, 4B, 5A, and 5B, the first mask pattern MK1 may be removed to expose a top surface of the interlayer dielectric layer IL. A conductive layer may be formed on an entire surface of the substrate 1, and the first trench TR1 and the pad holes SH1 may be filled with the conductive layer. A chemical mechanical polishing (CMP) process may be performed to remove the interlayer dielectric layer IL and the conductive layer on the gate capping patterns GC, thereby exposing top surfaces of the gate capping patterns GC. The conductive layer may undergo an etch-back process to form contact pads CA that fill lower portions of the pad holes SH1. The contact pads CA may be formed to have top surfaces lower than that of the gate electrode GE. On the contact pads CA, sidewalls of the gate spacers GS may be exposed, and likewise a sidewall of the interlayer dielectric layer IL may be exposed.

Referring to FIGS. 5A, 5B, 6A, and 6B, a first spacer layer 21 may be conformally formed on the entire surface of the substrate 1. The first spacer layer 21 may be formed of a material (e.g., silicon oxide or $Al_2O_3$) having an etch selectivity with respect to the gate spacer GS. The first spacer layer 21 may be formed by chemical vapor deposition (CVD) or atomic layer deposition (ALD). A second mask pattern MK2 having a second opening OP2 may be formed on the first spacer layer 21. The second opening OP2 may have its position and shape almost identical to those of the first opening OP1. The second mask pattern MK2 may be used as an etching mask to perform an anisotropic etch process on the first spacer layer 21 to form first dielectric spacers 21s that partially cover an inner wall (or sidewalls of the gate spacers GS) of the pad hole SH1 on the contact pad CA. The first dielectric spacers 21s may expose upper sidewalls and top surfaces of the gate spacers GS.

Like the first opening OP1, the second opening OP2 of the second mask pattern MK2 may be widely formed to help prevent aforementioned not-open issues in a present step.

Referring to FIGS. 6A, 6B, 7A, and 7B, the gate spacers GS may undergo a lateral etch process to form spacer recess regions R2 on the gate spacers GS. In this stage, a portion of the gate capping pattern GC may also be etched to round corners of the gate capping pattern GC. The gate spacers GS may have portions protected by the first dielectric spacers 21s, and the protected portions may not be etched. The formation of the spacer recess regions R2 may expand upper portions of the pad holes SH1. Therefore, any not-open issues caused by narrow intervals in subsequent processes may be reduced or prevented. The gate spacers GS exposed to the second opening OP2 may be formed to have first, second, and third segments 30a, 30b, and 30c discussed with reference to FIGS. 2A and 2B.

Referring to FIGS. 7A, 7B, 8A, and 8B, an anisotropic etch process may be performed after conformally forming a second spacer layer on the entire surface of the substrate 1. Therefore, second, third, and fourth dielectric spacers 23a, 23b, and 23c may be formed. The second dielectric spacer 23a may be formed to cover a sidewall of the first dielectric spacer 21s, and the third dielectric spacer 23b may be formed to cover a sidewall of the spacer recess region R2. The fourth dielectric spacer 23c may be formed to cover a sidewall of the second mask pattern MK2. As shown in cross-section of FIG. 8B taken along line C-C', the fourth dielectric spacer 23c may extend to cover a sidewall of the interlayer dielectric layer IL and the sidewall of the first dielectric spacer 21s.

Referring to FIGS. 8A, 8B, 9A, and 9B, a buried dielectric layer 25 may be formed on the entire surface of the substrate 1 to thereby fill the pad holes SH1 and the second opening OP2. The buried dielectric layer 25 may be formed of a material that exhibits excellent filling properties and has an etch selectivity with respect to the gate capping pattern GC. In an implementation, the buried dielectric layer 25 may be formed of SiOC.

Referring to FIGS. 9A, 9B, 10A, and 10B, a chemical mechanical polishing (CMP) process may be performed to remove the first spacer layer 21, the second mask pattern MK2, and portions of the buried dielectric layer 25 on the gate capping pattern GC to thereby form buried dielectric patterns 25p in the pad holes SH1. The formation of the buried dielectric patterns 25p may expose the top surface of the interlayer dielectric layer IL and the top surface of the gate capping pattern GC. The buried dielectric patterns 25p may cover the spacer recess regions R2.

Referring to FIGS. 10A, 10B, 11A, and 11B, a third mask pattern MK3 may be formed on the interlayer dielectric layer IL. The third mask pattern MK3 may include third openings OP3 that expose the top surfaces of the gate capping patterns GC. The third openings OP3 may be formed to have widths greater than those of the gate capping patterns GC thereunder. Thus, the third openings OP3 may partially expose the buried dielectric patterns 25p and the gate spacers GS.

Referring to FIGS. 11A, 11B, 12A, and 12B, the third mask pattern MK3 may be used as an etching mask to etch the gate capping patterns GC to thereby form a gate contact hole GH that exposes the gate electrode GE. In this step, the buried dielectric pattern 25p and the third dielectric spacer 23b may also be partially etched. The gate contact hole GH may be formed in a self-aligned contact (SAC) etching manner. Therefore, it may be possible to prevent misalignment of a gate contact CB which will be discussed below.

Referring to FIGS. 12A, 12B, 13A, and 13B, the third mask pattern MK3 may be removed. A fourth mask pattern MK4 may be formed on the interlayer dielectric layer IL. The fourth mask pattern MK4 may fill the gate contact holes GH and may include fourth openings OP4 that partially expose the buried dielectric patterns 25p. The fourth mask pattern MK4 may be formed of spin-on-hardmask (SOH) having excellent filling properties. The fourth openings OP4 may overlap corresponding pad holes SH1.

Referring to FIGS. 13A, 13B, 14A, and 14B, the fourth mask pattern MK4 may be used as an etching mask to partially remove the buried dielectric patterns 25p to thereby form source/drain contact holes CH that expose top surfaces of the contact pads CA. As shown in cross-section of FIG. 14B taken along line A-A', the source/drain contact hole CH may expose a sidewall of the second dielectric spacer 23a. In addition, the buried dielectric pattern 25p may partially remain in the spacer recess region R2. When the source/drain contact hole CH is formed, the second dielectric spacer 23a may protect the first dielectric spacer 21s and the gate spacer GS, and thus the first dielectric spacer 21s and the gate spacer GS may be prevented from being etched. Therefore, an electric short may be prevented between a gate contact CB and a source/drain contact LA which will be formed subsequently. The source/drain contact hole CH may be formed in a self-aligned contact (SAC) etching manner. As a result, it may be possible to prevent misalignment of a source/drain contact LA which will be discussed below.

Referring to FIGS. 14A, 14B, 15A, and 15B, the fourth mask pattern MK4 may be removed to expose the gate electrode GE in the gate contact hole GH. The fourth mask pattern MK4 may be removed by an ashing process. In an implementation, a conductive layer may be formed on the entire surface of the substrate 1 to thereby fill the gate contact hole GH and the source/drain contact hole CH. A chemical mechanical polishing (CMP) process may be performed to remove the conductive layer on the interlayer dielectric layer IL, to form a gate contact CB in the gate contact hole GH, and to form a source/drain contact LA in the source/drain contact hole CH, as shown in FIGS. 1A and 1B. The CMP process may also partially remove upper portions of the interlayer dielectric layer IL, the gate spacers GS, the third and fourth dielectric spacers 23b and 23c, and the buried dielectric pattern 25p. In conclusion, a semiconductor device may be fabricated as illustrated in FIGS. 1A and 1B.

According to an embodiment, a method of fabricating a semiconductor device may help prevent not only not-open issues but also electric shorts. Moreover, contact holes may be formed in a self-aligned contact (SAC) etching manner, and thus contacts may be prevented from being misaligned. Thus, it may be possible to increase a yield and to improve reliability of the semiconductor device.

Figure 16A:
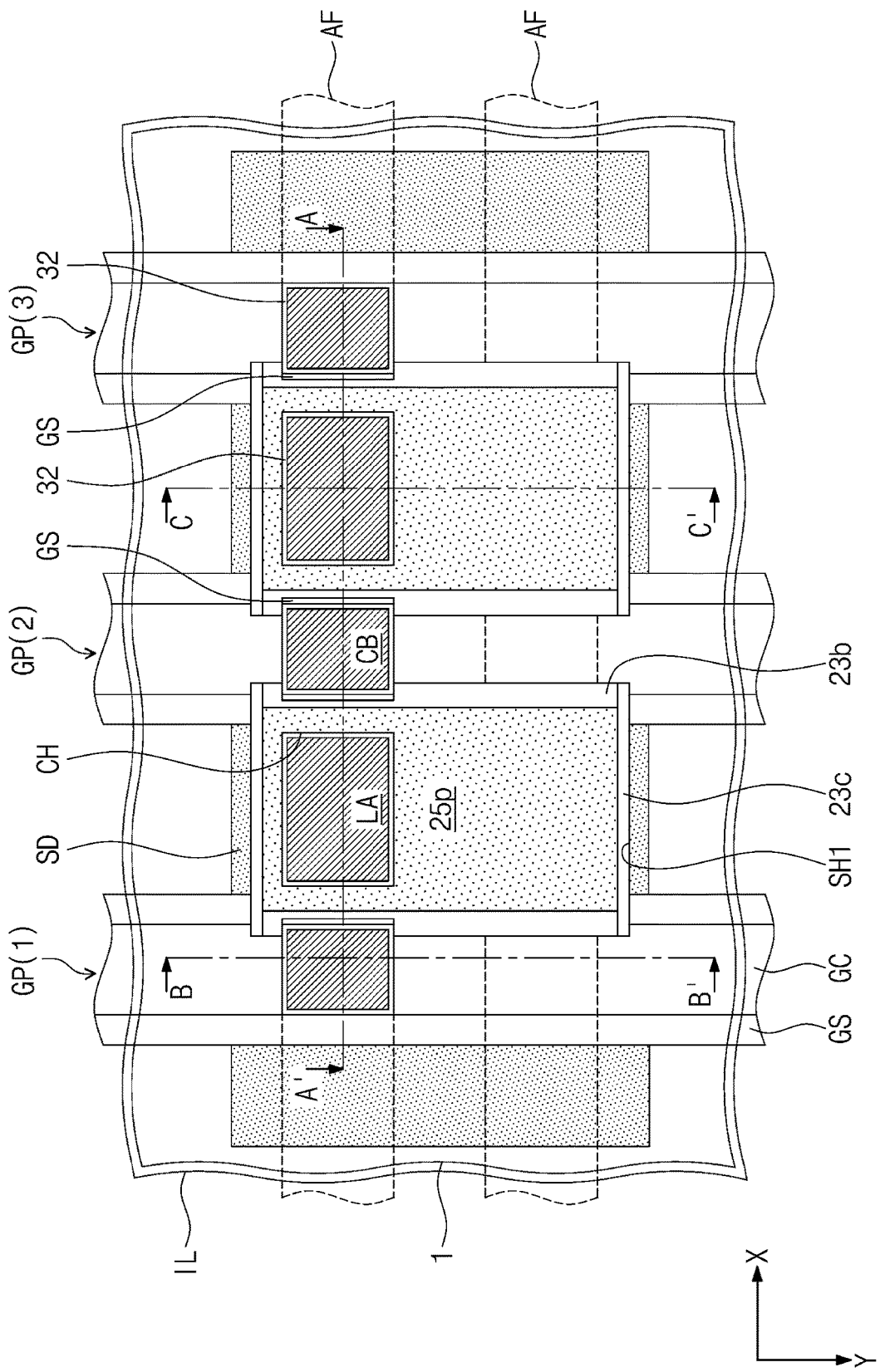
FIG. 16A illustrates a plan view of a semiconductor device according to some example embodiments.
Figure 16B:
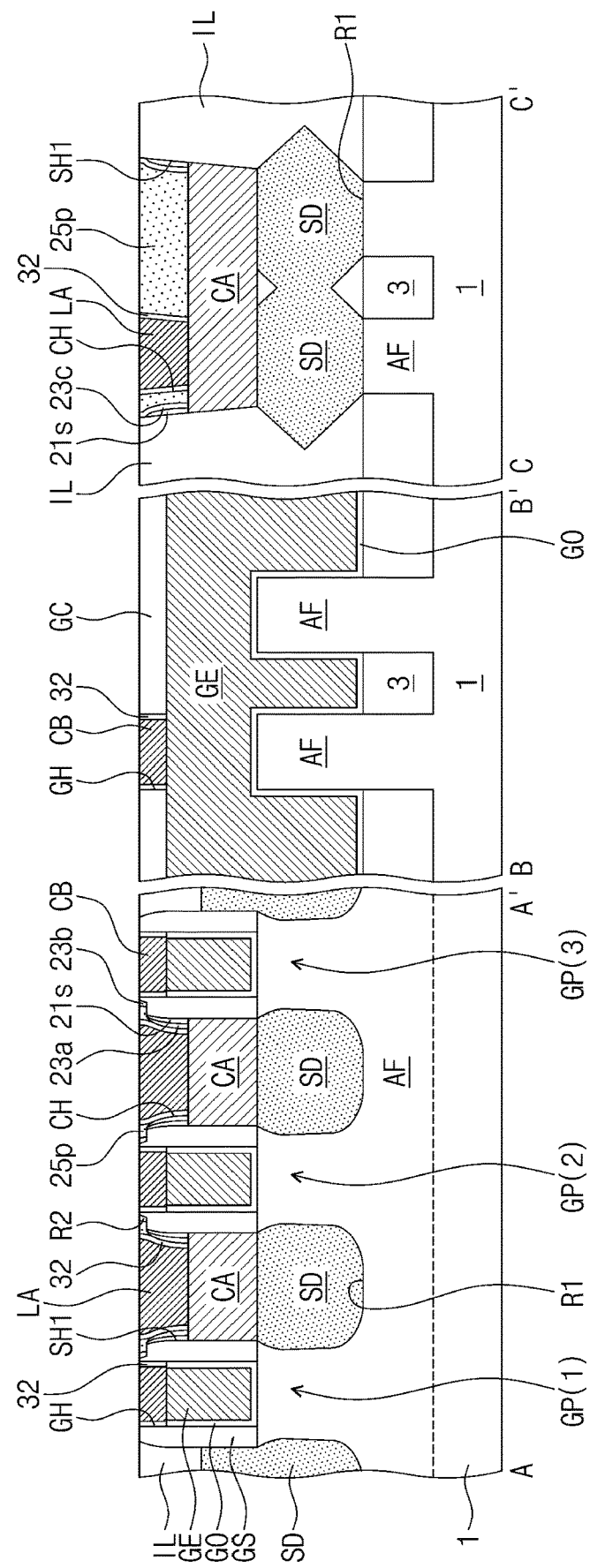
FIG. 16B illustrates a cross-sectional view taken along lines A-A', B-B', and C-C' of FIG. 16A.

FIG. 16A illustrates a plan view of a semiconductor device according to some example embodiments. FIG. 16B illustrates a cross-sectional view taken along lines A-A', B-B', and C-C' of FIG. 16A. A semiconductor device of FIG. 16B may correspond to an example of FinFET devices.

Referring to FIGS. 16A and 16B, a semiconductor device according to the present embodiment may further include a fifth dielectric spacer 32. As shown in cross-section of FIG. 16B taken along line A-A', the fifth dielectric spacer 32 may cover an inner wall of the gate contact hole GH. The fifth dielectric spacer 32 may be between the gate contact CB and the gate spacer GS. In addition, as shown in cross-section of FIG. 16B taken along line A-A', the fifth dielectric spacer 32 may be between the second dielectric spacer 23a and the source/drain contact LA and between the buried dielectric pattern 25p and the source/drain contact LA. As shown in cross-section of FIG. 16B taken along line B-B', the fifth dielectric spacer 32 may be between the gate contact CB and the gate capping pattern GC. As shown in cross-section of FIG. 16B taken along line C-C', the fifth dielectric spacer 32 may be between the buried dielectric pattern 25p and the source/drain pattern LA. The fifth dielectric spacer 32 may be formed of a silicon oxide layer, a silicon nitride layer, or a silicon oxynitride layer. Other configurations may be identical or similar to those discussed with reference to FIGS. 1A, 1B, 2A, and 2B.

The semiconductor device of FIGS. 16A and 16B may be fabricated such that a third spacer layer may be conformally formed on the entire surface of the substrate 1 and then anisotropically etched to form the fifth dielectric spacer 32. Other processes may be identical or similar to those discussed with reference to FIGS. 3A to 15B.

Figure 17:
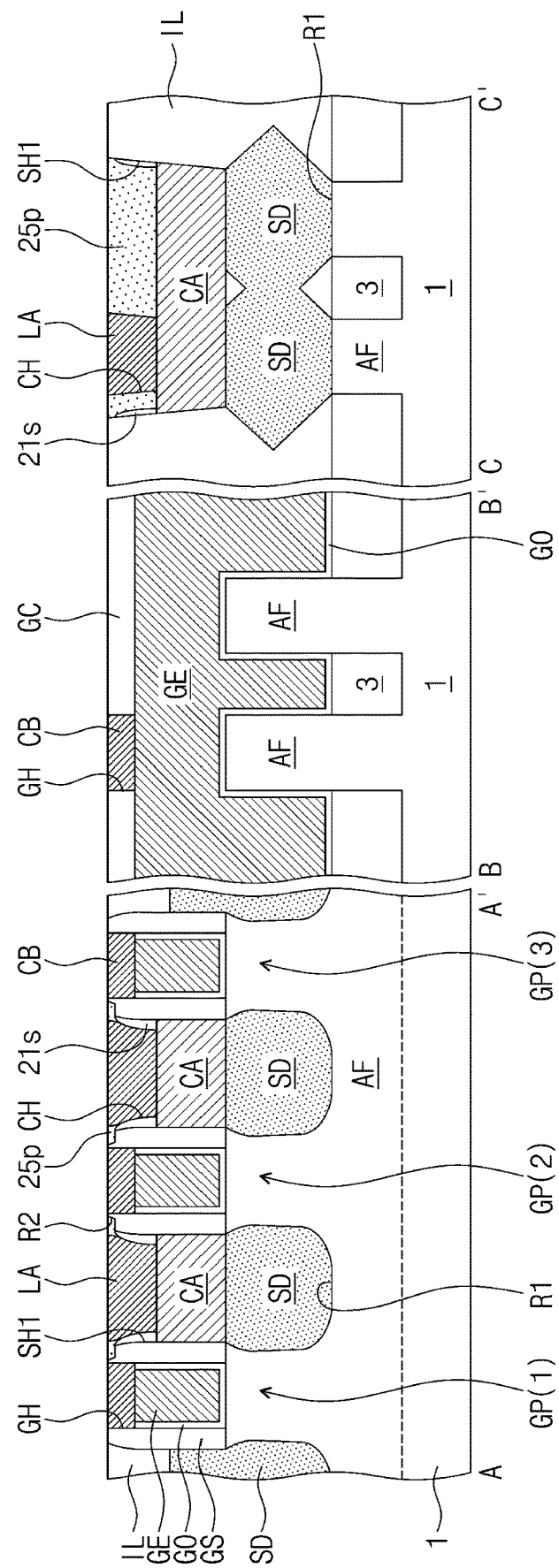
FIG. 17 illustrates an alternate cross-sectional view taken along lines A-A', B-B', and C-C' of FIG. 1A.

FIG. 17 illustrates an alternate cross-sectional view taken along lines A-A', B-B', and C-C' of FIG. 1A.

Referring to FIG. 17, the second, third, and fourth dielectric spacers 23a, 23b, and 23c may be omitted from the semiconductor device of FIG. 1B. In an implementation, the first dielectric spacer 23s may be in direct contact with the source/drain contact LA. The buried dielectric pattern 25p between the source/drain contact LA and the gate contact CB may be in direct contact with the source/drain contact LA. Other configurations may be identical or similar to those discussed with reference to FIGS. 1A and 1B. A semiconductor device of FIG. 17 may be fabricated by omitting the process of FIGS. 8A and 8B and subsequently performing the processes of FIGS. 9A to 15B.

Figure 18A:
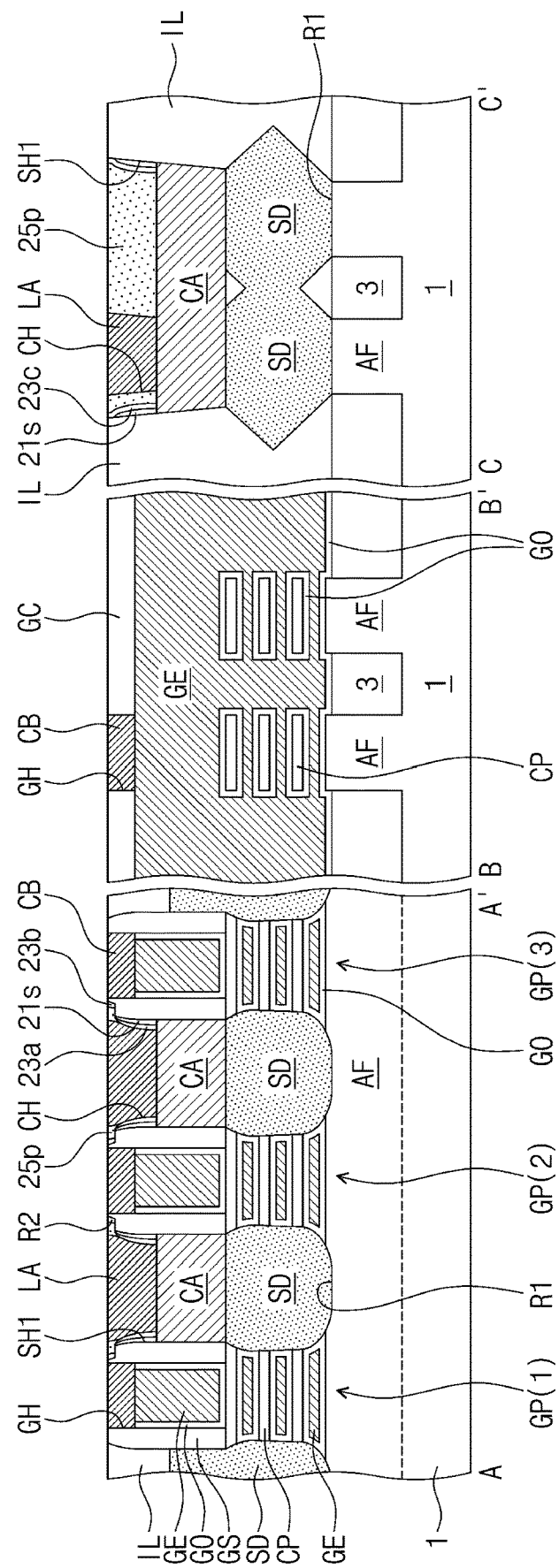
FIG. 18A illustrates an alternate cross-sectional view taken along lines A-A', B-B', and C-C' of FIG. 1A.

FIG. 18A illustrates an alternate cross-sectional view taken along lines A-A', B-B', and C-C' of FIG. 1A. A semiconductor device of FIG. 18A may correspond to an example of multi-bridge channel field effect transistor (MBCFET) devices.

Referring to FIG. 18A, semiconductor patterns CP that are spaced apart from each other and sequentially stacked may be on the active fin AF. The semiconductor patterns CP may be spaced apart from the active fin AF. The semiconductor patterns CP may include, e.g., silicon. The gate electrode GE may cover top and lateral surfaces of the semiconductor patterns CP. The semiconductor patterns CP may have widths different from each other.

A portion of the gate electrode GE may extend between the semiconductor patterns CP. The gate dielectric layer GO may surround the semiconductor patterns CP. The semiconductor patterns CP may have sidewalls in contact (e.g., direct contact) with the source/drain pattern SD. Other configurations may be identical or similar to those discussed with reference to FIG. 1B.

Figure 18B:
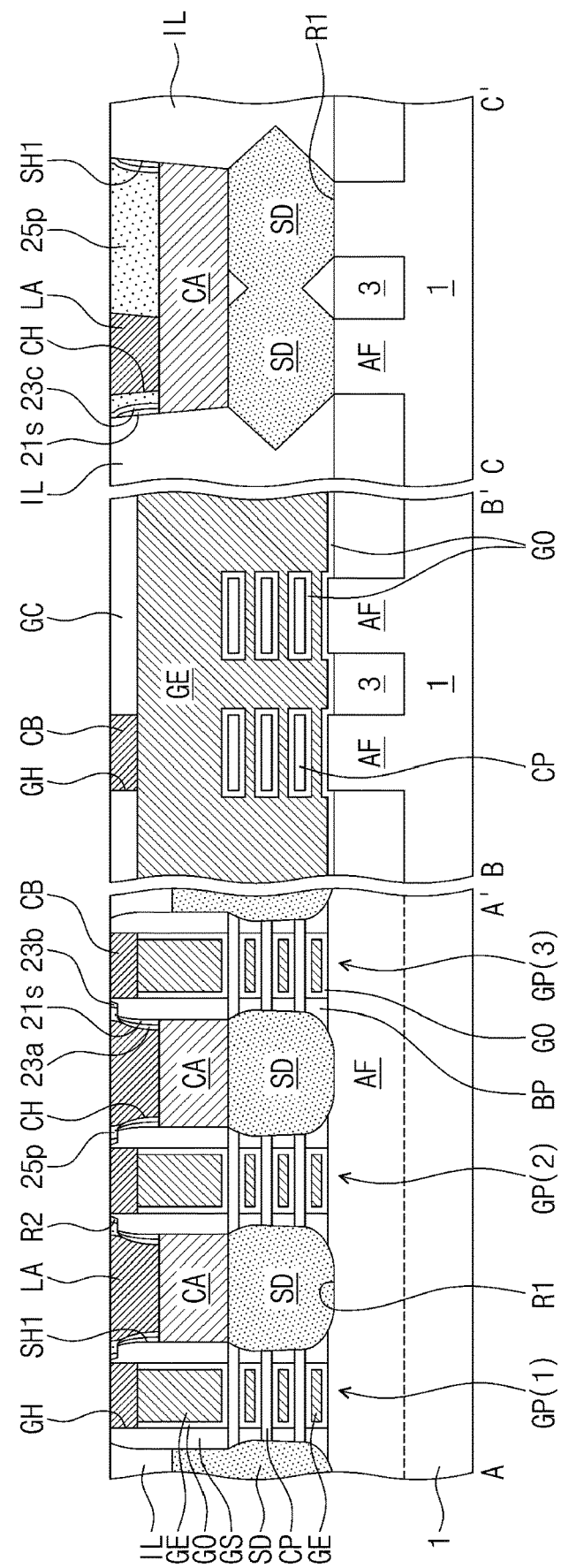
FIG. 18B illustrates an alternate cross-sectional view taken along lines A-A', B-B', and C-C' of FIG. 1A.

FIG. 18B illustrates an alternate cross-sectional view taken along lines A-A', B-B', and C-C' of FIG. 1A. A semiconductor device of FIG. 18B may correspond to an example of multi-bridge channel field effect transistor (MBCFET) devices.

Referring to FIG. 18B, a semiconductor device according to the present embodiment may further include, below the semiconductor patterns CP, a barrier dielectric pattern BP that surrounds a portion of the gate electrode GE and is between the gate dielectric layer GO and the source/drain pattern SD. The barrier dielectric pattern BP may include a material, e.g., a silicon nitride layer, different from that of the gate dielectric layer GO. The barrier dielectric pattern BP may help prevent bridge between the source/drain pattern SD and a portion of the gate electrode GE, and thus the semiconductor device may increase in reliability. Other configurations may be identical or similar to those discussed above with reference to FIG. 18A.

By way of summation and review, semiconductor devices have increasingly had high integration with the advanced development of the electronic industry. For example, semiconductor devices have increasingly exhibited high reliability, high speed, and/or multi-functionality. Semiconductor devices may be complicated and integrated to meet these characteristics.

A semiconductor device according to an embodiment may include a plurality of dielectric spacers between a gate spacer and a source/drain contact, and thus an electrical short and parasitic capacitance may be reduced or prevented between the source/drain contact and one or more of a gate electrode and a gate contact, which may increase reliability of the semiconductor device.

A semiconductor device fabrication method according to an embodiment may decrease process failure and may increase a yield.

One or more embodiments may provide a semiconductor device with increased reliability.

One or more embodiments may provide a method of fabricating a semiconductor device which method increases a yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a gate pattern on the substrate, the gate pattern including a gate dielectric layer, a gate electrode, and a gate capping pattern that are sequentially stacked;
   a gate spacer that covers a sidewall of the gate pattern;
   a source/drain pattern in the substrate at a side of the gate pattern;
   a metal contact pad on the source/drain pattern, the metal contact pad having a top surface lower than a top surface of the gate electrode;
   a source/drain contact on the metal contact pad; and
   a buried dielectric pattern between the gate spacer and the source/drain contact, the buried dielectric pattern surrounding the source/drain contact,
   wherein:
   the gate spacer includes:
      a first segment between the gate electrode and the source/drain pattern, the first segment having a first width;
      a second segment that extends from the first segment and is between the gate electrode and the source/drain contact, the second segment having the first width; and
      a third segment on the second segment, the third segment having a second width that is less than the first width,
   the buried dielectric pattern is between the third segment and the source/drain contact, and
   the buried dielectric pattern is absent between the first segment and the metal contact pad and is absent between the second segment and the source/drain contact,
   wherein the semiconductor device further comprises:
      a first dielectric spacer between the second segment and the source/drain contact, the first dielectric spacer being spaced apart from the third segment, and
      a second dielectric spacer between the first dielectric spacer and the source/drain contact, and
   wherein the first dielectric spacer and the second dielectric spacer are in contact with an upper surface of the metal contact pad.

2. The semiconductor device as claimed in claim 1, wherein the buried dielectric pattern is in contact with a top surface of the second segment and is spaced apart from the third segment.

3. The semiconductor device as claimed in claim 1, wherein the buried dielectric pattern includes SiOC.

4. The semiconductor device as claimed in claim 1, wherein the first dielectric spacer includes a material different from a material of the buried dielectric pattern and different from a material of the gate spacer.

5. The semiconductor device as claimed in claim 4, wherein:
   the buried dielectric pattern has a third width, and the first dielectric spacer has a fourth width less than the third width.

6. The semiconductor device as claimed in claim 4, wherein the second dielectric spacer includes a material different from the material of the buried dielectric pattern and different from the material of the first dielectric spacer.

7. The semiconductor device as claimed in claim 6, further comprising a third dielectric spacer between the third segment and the buried dielectric pattern, the third dielectric spacer exposing a portion of a top surface of the second segment,
wherein the third dielectric spacer includes a same material as the material of the second dielectric spacer.

8. The semiconductor device as claimed in claim 7, further comprising a fourth dielectric spacer between the buried dielectric pattern and the source/drain contact and between the second dielectric spacer and the source/drain contact.

9. The semiconductor device as claimed in claim 8, further comprising:
a gate contact that penetrates the gate capping pattern and contacts the gate electrode; and
a fifth dielectric spacer between the gate contact and the gate spacer,
wherein the fifth dielectric spacer includes a material that is the same as a material of the fourth dielectric spacer.

10. The semiconductor device as claimed in claim 6, further comprising a third dielectric spacer between the third segment and the buried dielectric pattern, the third dielectric spacer exposing a portion of a top surface of the second segment,
wherein the third dielectric spacer includes a material different from the material of the buried dielectric pattern.

11. The semiconductor device as claimed in claim 1, wherein:
the first segment is in contact with the metal contact pad,
the second segment is spaced apart from the source/drain contact, and
the third segment is spaced apart from the source/drain contact.

12. A semiconductor device, comprising:
a substrate;
an active fin that protrudes from the substrate;
a gate pattern that runs across the active fin, the gate pattern including a gate dielectric layer, a gate electrode, and a gate capping pattern that are sequentially stacked;
a source/drain pattern in the substrate on a side of the gate pattern;
a metal contact pad on the source/drain pattern, the metal contact pad having a top surface lower than a top surface of the gate electrode;
a source/drain contact on the contact pad;
a gate spacer that includes a first segment between the gate pattern and the metal contact pad, a second segment between the gate pattern and the source/drain contact, and a third segment on the second segment, the third segment having a width less than a width of the second segment;
a first dielectric spacer and a second dielectric spacer between the second segment and the source/drain contact; and
a third dielectric spacer and a buried dielectric pattern between the third segment and the source/drain contact,
wherein a width of the buried dielectric pattern is greater than a width of the first dielectric spacer, greater than a width of the second dielectric spacer, and greater than a width of the third dielectric spacer, and
the first dielectric spacer and the second dielectric spacer are in contact with an upper surface of the metal contact pad.

13. The semiconductor device as claimed in claim 12, wherein a width of a bottom surface of the source/drain contact is less than a width of the metal contact pad.

14. The semiconductor device as claimed in claim 12, wherein the buried dielectric pattern surrounds the source/drain contact.

15. The semiconductor device as claimed in claim 12, wherein:
the buried dielectric pattern includes a first material different from a second material of the first dielectric spacer and different from a third material of the second dielectric spacer, and
the second dielectric spacer and the third dielectric spacer include the third material.

16. The semiconductor device as claimed in claim 12, wherein the buried dielectric pattern covers a top end of the first dielectric spacer, a top end of the second dielectric spacer, and a sidewall of the third dielectric spacer.

17. A semiconductor device, comprising:
a substrate;
a gate pattern on the substrate and including a gate dielectric layer, a gate electrode, and a gate capping pattern that are sequentially stacked, the gate pattern having a first sidewall and a second sidewall that are opposite to each other;
a source/drain pattern in the substrate adjacent to the first sidewall of the gate pattern;
a metal contact pad on the source/drain pattern, the metal contact pad having a top surface lower than a top surface of the gate electrode;
a source/drain contact on the metal contact pad;
a first gate spacer that covers the first sidewall of the gate pattern; and
a second gate spacer that covers the second sidewall of the gate pattern,
wherein:
the first gate spacer includes a first segment between the gate pattern and the metal contact pad, a second segment between the gate pattern and the source/drain contact, and a third segment on the second segment, the third segment having a width less than a width of the second segment,
the width of the third segment is less than a width of the second gate spacer,
the semiconductor device further comprises:
a first dielectric spacer between the second segment and the source/drain contact, the first dielectric spacer being spaced apart from the third segment, and
a second dielectric spacer between the first dielectric spacer and the source/drain contact, and
the first dielectric spacer and the second dielectric spacer are in contact with an upper surface of the metal contact pad.

18. The semiconductor device as claimed in claim 17, further comprising:
a third dielectric spacer and a buried dielectric pattern between the third segment and the source/drain contact,
wherein a width of the buried dielectric pattern is greater than a width of the first dielectric spacer, greater than a width of the second dielectric spacer, and greater than a width of the third dielectric spacer.

19. The semiconductor device as claimed in claim 18, wherein the buried dielectric pattern surrounds the source/drain contact.

20. The semiconductor device as claimed in claim 18, wherein:
- the buried dielectric pattern includes a first material different from a second material of the first dielectric spacer and different from a third material of the second dielectric spacer, and
- the second dielectric spacer and the third dielectric spacer include the third material.

\* \* \* \* \*